US011389865B2

(12) United States Patent
Ghoshal et al.

(10) Patent No.: US 11,389,865 B2
(45) Date of Patent: *Jul. 19, 2022

(54) SINTERING MATERIALS AND ATTACHMENT METHODS USING SAME

(71) Applicant: ALPHA ASSEMBLY SOLUTIONS INC., South Plainfield, NJ (US)

(72) Inventors: Shamik Ghoshal, Bangalore (IN); V. Sathish Kumar, Bangalore (IN); Pavan Vishwanath, Bangalore (IN); Ranjit S. Pandher, Plainsboro, NJ (US); Remya Chandran, Bangalore (IN); Sutapa Mukherjee, Bangalore (IN); Siuli Sarkar, Bangalore (IN); Bawa Singh, Marlton, NJ (US); Ravindra Mohan Bhatkal, East Brunswick, NJ (US)

(73) Assignee: Alpha Assembly Solutions Inc., Waterbury, CT (US)

( * ) Notice: Subject to any disclaimer, the term of this patent is extended or adjusted under 35 U.S.C. 154(b) by 571 days.

This patent is subject to a terminal disclaimer.

(21) Appl. No.: 15/316,684

(22) PCT Filed: Jun. 12, 2015

(86) PCT No.: PCT/US2015/035566
§ 371 (c)(1),
(2) Date: Dec. 6, 2016

(87) PCT Pub. No.: WO2015/192004
PCT Pub. Date: Dec. 17, 2015

(65) Prior Publication Data
US 2017/0144221 A1 May 25, 2017

(30) Foreign Application Priority Data
Jun. 12, 2014 (IN) .......................... 2873/CHE/2014

(51) Int. Cl.
*B22F 1/07* (2022.01)
*H01L 23/00* (2006.01)
(Continued)

(52) U.S. Cl.
CPC .................. *B22F 1/07* (2022.01); *B22F 1/16* (2022.01); *B22F 3/1017* (2013.01); *B22F 3/22* (2013.01);
(Continued)

(58) Field of Classification Search
CPC .......... B22F 1/0044; B22F 1/02; B22F 1/025; B22F 1/16; B22F 1/17
See application file for complete search history.

(56) References Cited

U.S. PATENT DOCUMENTS 10,103,410 B2 * 10/2018 Kumar .............. H01M 10/3963
10,131,177 B2 * 11/2018 Knipp .................... B42D 25/30
(Continued)

FOREIGN PATENT DOCUMENTS

| CN | 102131602 | 7/2011 |
|----|-----------|--------|
| CN | 103262172 | 8/2013 |

(Continued)

*Primary Examiner* — Anthony J Zimmer
*Assistant Examiner* — Sean P. O'Keefe
(74) *Attorney, Agent, or Firm* — Stinson LLP

(57) ABSTRACT

Methods for die attachment of multichip and single components including flip chips may involve printing a sintering paste on a substrate or on the back side of a die. Printing may involve stencil printing, screen printing, or a dispensing process. Paste may be printed on the back side of an entire wafer prior to dicing, or on the back side of an individual die. Sintering films may also be fabricated and transferred to a wafer, die or substrate. A post-sintering step may increase throughput.

23 Claims, 33 Drawing Sheets

(51) Int. Cl.
| | |
|---|---|
| B22F 7/04 | (2006.01) |
| B22F 3/10 | (2006.01) |
| B22F 1/16 | (2022.01) |
| B23K 35/02 | (2006.01) |
| B22F 1/17 | (2022.01) |
| B22F 3/22 | (2006.01) |
| B22F 5/00 | (2006.01) |
| H01L 21/683 | (2006.01) |
| B23K 1/00 | (2006.01) |
| B23K 3/06 | (2006.01) |
| B23K 35/30 | (2006.01) |
| H01L 21/78 | (2006.01) |
| B23K 101/40 | (2006.01) |
| H05K 3/32 | (2006.01) |

(52) U.S. Cl.
CPC ............. *B22F 5/006* (2013.01); *B22F 7/04* (2013.01); *B23K 1/0016* (2013.01); *B23K 3/0607* (2013.01); *B23K 35/0244* (2013.01); *B23K 35/3006* (2013.01); *H01L 21/6835* (2013.01); *H01L 21/78* (2013.01); *H01L 24/11* (2013.01); *H01L 24/13* (2013.01); *H01L 24/27* (2013.01); *H01L 24/29* (2013.01); *H01L 24/75* (2013.01); *H01L 24/81* (2013.01); *H01L 24/83* (2013.01); *H01L 24/94* (2013.01); *H01L 24/95* (2013.01); *H01L 24/97* (2013.01); *B22F 1/17* (2022.01); *B22F 2007/047* (2013.01); *B22F 2301/255* (2013.01); *B22F 2999/00* (2013.01); *B23K 2101/40* (2018.08); *H01L 24/05* (2013.01); *H01L 24/16* (2013.01); *H01L 24/32* (2013.01); *H01L 24/84* (2013.01); *H01L 24/85* (2013.01); *H01L 2221/68313* (2013.01); *H01L 2221/68368* (2013.01); *H01L 2224/04026* (2013.01); *H01L 2224/05155* (2013.01); *H01L 2224/05639* (2013.01); *H01L 2224/111* (2013.01); *H01L 2224/11003* (2013.01); *H01L 2224/11009* (2013.01); *H01L 2224/1144* (2013.01); *H01L 2224/11332* (2013.01); *H01L 2224/11334* (2013.01); *H01L 2224/11438* (2013.01); *H01L 2224/11505* (2013.01); *H01L 2224/11848* (2013.01); *H01L 2224/1338* (2013.01); *H01L 2224/1339* (2013.01); *H01L 2224/1349* (2013.01); *H01L 2224/13139* (2013.01); *H01L 2224/13294* (2013.01); *H01L 2224/13295* (2013.01); *H01L 2224/13311* (2013.01); *H01L 2224/13324* (2013.01); *H01L 2224/13339* (2013.01); *H01L 2224/13347* (2013.01); *H01L 2224/13355* (2013.01); *H01L 2224/13363* (2013.01); *H01L 2224/13384* (2013.01); *H01L 2224/13387* (2013.01); *H01L 2224/13393* (2013.01); *H01L 2224/13411* (2013.01); *H01L 2224/13439* (2013.01); *H01L 2224/13444* (2013.01); *H01L 2224/13455* (2013.01); *H01L 2224/13464* (2013.01); *H01L 2224/13469* (2013.01); *H01L 2224/16227* (2013.01); *H01L 2224/271* (2013.01); *H01L 2224/27002* (2013.01); *H01L 2224/27003* (2013.01); *H01L 2224/27009* (2013.01); *H01L 2224/2732* (2013.01); *H01L 2224/2744* (2013.01); *H01L 2224/2782* (2013.01); *H01L 2224/27312* (2013.01); *H01L 2224/27332* (2013.01); *H01L 2224/27334* (2013.01); *H01L 2224/27438* (2013.01); *H01L 2224/27505* (2013.01); *H01L 2224/27821* (2013.01); *H01L 2224/27848* (2013.01); *H01L 2224/2938* (2013.01); *H01L 2224/2939* (2013.01); *H01L 2224/2949* (2013.01); *H01L 2224/2969* (2013.01); *H01L 2224/29139* (2013.01); *H01L 2224/29294* (2013.01); *H01L 2224/29295* (2013.01); *H01L 2224/29311* (2013.01); *H01L 2224/29324* (2013.01); *H01L 2224/29339* (2013.01); *H01L 2224/29344* (2013.01); *H01L 2224/29347* (2013.01); *H01L 2224/29355* (2013.01); *H01L 2224/29363* (2013.01); *H01L 2224/29364* (2013.01); *H01L 2224/29384* (2013.01); *H01L 2224/29387* (2013.01); *H01L 2224/29393* (2013.01); *H01L 2224/29411* (2013.01); *H01L 2224/29439* (2013.01); *H01L 2224/29444* (2013.01); *H01L 2224/29455* (2013.01); *H01L 2224/29464* (2013.01); *H01L 2224/29469* (2013.01); *H01L 2224/32225* (2013.01); *H01L 2224/32245* (2013.01); *H01L 2224/45014* (2013.01); *H01L 2224/7598* (2013.01); *H01L 2224/75251* (2013.01); *H01L 2224/75316* (2013.01); *H01L 2224/81002* (2013.01); *H01L 2224/8184* (2013.01); *H01L 2224/81191* (2013.01); *H01L 2224/81948* (2013.01); *H01L 2224/83002* (2013.01); *H01L 2224/8384* (2013.01); *H01L 2224/83191* (2013.01); *H01L 2224/83193* (2013.01); *H01L 2224/83222* (2013.01); *H01L 2224/83439* (2013.01); *H01L 2224/83444* (2013.01); *H01L 2224/83447* (2013.01); *H01L 2224/83948* (2013.01); *H01L 2224/94* (2013.01); *H01L 2224/95* (2013.01); *H01L 2224/97* (2013.01); *H01L 2924/00014* (2013.01); *H01L 2924/0463* (2013.01); *H01L 2924/0503* (2013.01); *H01L 2924/05032* (2013.01); *H01L 2924/2011* (2013.01); *H01L 2924/2064* (2013.01); *H01L 2924/20105* (2013.01); *H01L 2924/20106* (2013.01); *H01L 2924/20107* (2013.01); *H01L 2924/20108* (2013.01); *H01L 2924/20109* (2013.01); *H05K 3/32* (2013.01); *H05K 2203/1131* (2013.01)

(56) References Cited

U.S. PATENT DOCUMENTS

| | | | | |
|---|---|---|---|---|
| 10,239,153 | B2* | 3/2019 | Workman | B23K 20/227 |
| 10,265,813 | B2* | 4/2019 | Sweetman | B22F 7/062 |
| 10,508,328 | B2* | 12/2019 | Malpica | B21D 22/022 |
| 2005/0129843 | A1 | 6/2005 | Wu et al. | |
| 2009/0029504 | A1 | 1/2009 | Paik et al. | |
| 2009/0162557 | A1* | 6/2009 | Lu | B22F 1/0059 |
| | | | | 427/383.3 |
| 2011/0183128 | A1* | 7/2011 | Magdassi | B01J 13/02 |
| | | | | 428/207 |
| 2011/0318213 | A1 | 12/2011 | Handwerker et al. | |
| 2012/0009089 | A1 | 1/2012 | Yu et al. | |
| 2012/0114927 | A1* | 5/2012 | Khaselev | H01L 24/75 |
| | | | | 428/220 |
| 2012/0219703 | A1* | 8/2012 | Son | B22F 3/22 |
| | | | | 427/123 |
| 2013/0216848 | A1* | 8/2013 | Kalich | B22F 1/02 |
| | | | | 428/554 |
| 2014/0120356 | A1* | 5/2014 | Shearer | C09J 11/02 |
| | | | | 428/457 |

(56) References Cited

U.S. PATENT DOCUMENTS

2015/0240130 A1* 8/2015 Liang .................. C09J 9/02
                                                    428/206
2016/0225737 A1* 8/2016 Khaselev .............. B32B 5/16

FOREIGN PATENT DOCUMENTS

| EP | 2130627 | 12/2009 |
|----|---------|---------|
| EP | 2418170 | 2/2012 |
| JP | 2004095832 A | 3/2004 |
| JP | 2005044986 A | 2/2005 |
| JP | 2007-224420 | 9/2007 |
| JP | 2010-185135 | 8/2010 |
| JP | 2014-503936 | 2/2014 |
| JP | 5725248 B1 | 5/2015 |
| KR | 10-2011-0028632 | 3/2011 |
| KR | 10-2013-0129965 | 11/2013 |
| WO | 2009/156990 A1 | 12/2009 |
| WO | WO2012/061511 | 5/2012 |
| WO | 2014068299 | 5/2014 |

* cited by examiner

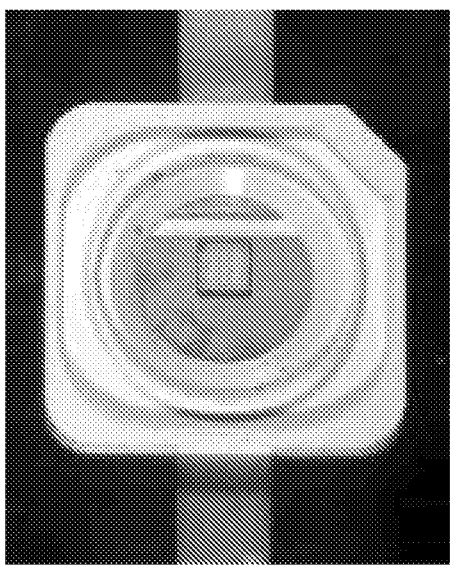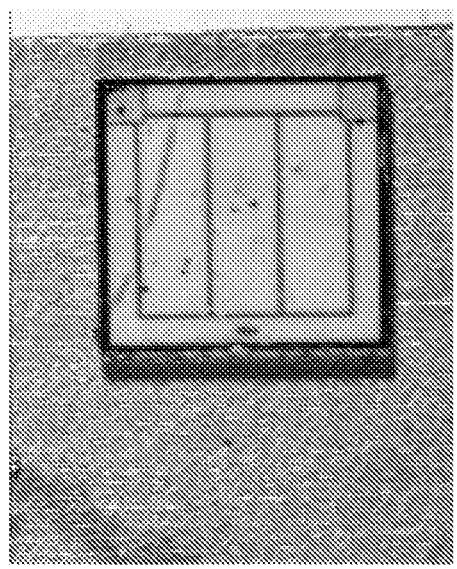
FIG. 9

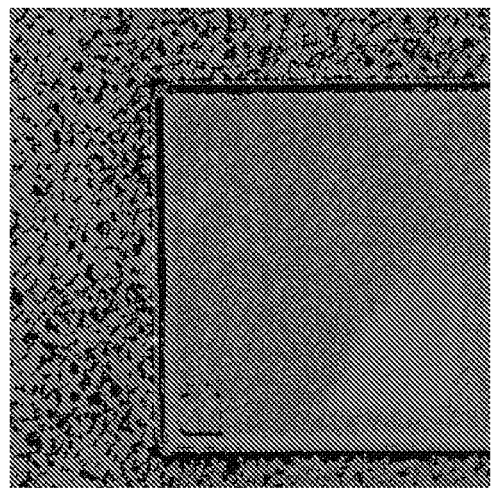
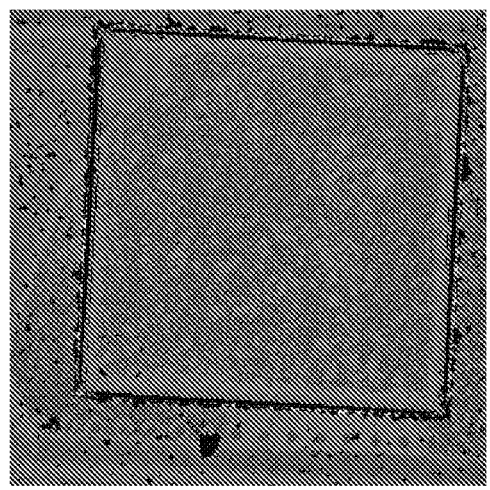
FIG. 23B

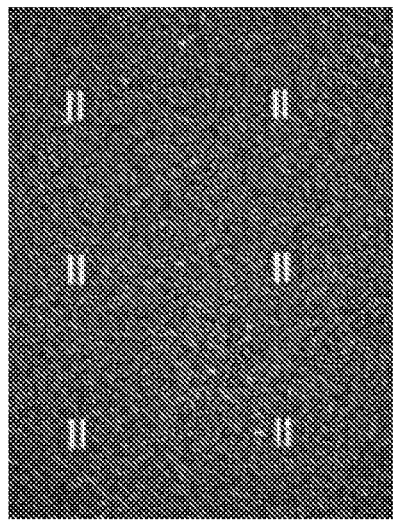
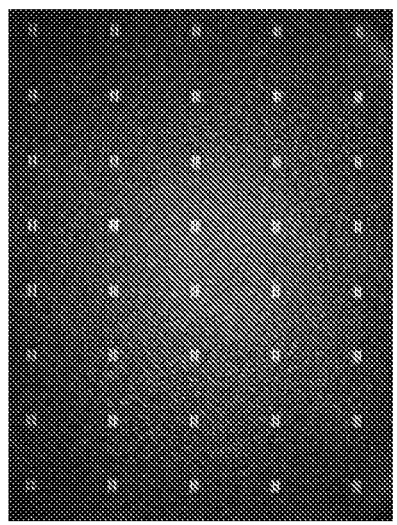
FIG. 26

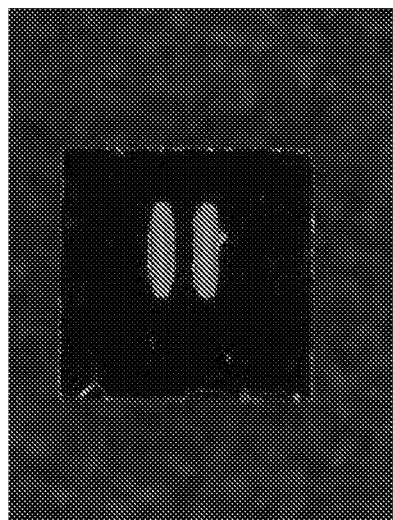
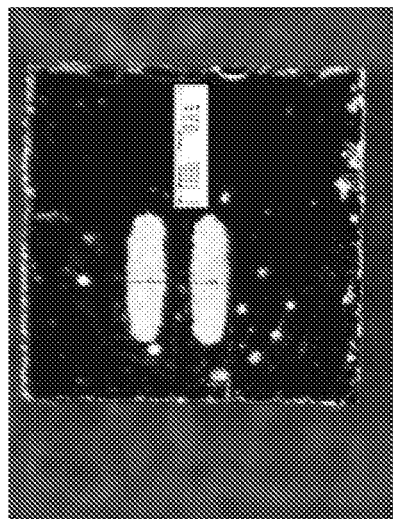
FIG. 27

SINTERING MATERIALS AND ATTACHMENT METHODS USING SAME

FIELD OF THE TECHNOLOGY

One or more aspects relate generally to methods for attachment of various components, and more specifically to sintering materials and techniques used for such attachment.

BACKGROUND

Sintering has emerged as an alternative technology to conventional soldering. Sintering typically involves high temperature and high pressure processing to attach various components of an assembly.

SUMMARY

In accordance with one or more embodiments, a composition may include a metal powder having a $d_{50}$ range of about 0.001 to about 10 micrometers, the metal powder comprising about 30 to about 95 wt % of the paste, a binder having a softening point between about 50 and about 170° C., the binder comprising about 0.1 to about 5 wt % of the paste, and a solvent in an amount sufficient to dissolve at least the binder.

In some embodiments, the metal powder may comprise gold, palladium, silver, copper, aluminum, silver palladium alloy or gold palladium alloy. The metal powder may comprise silver particles. In at least some embodiments, the metal powder may comprise nanoparticles. The metal powder may comprise coated metal particles. In some embodiments, the composition may further include one or more functional additives.

In accordance with one or more embodiments, a film may comprise a layer of a composition including a metal powder having a $d_{50}$ range of about 0.001 to about 10 micrometers, the metal powder comprising about 30 to about 95 wt % of the paste, a binder having a softening point between about 50 and about 170° C., the binder comprising about 0.1 to about 5 wt % of the paste, and a solvent in an amount sufficient to dissolve at least the binder. In some embodiments, the film may have a dry thickness of about 5 to about 300 microns.

In some embodiments, the layer of the composition is on a polymeric, glass, metal or ceramic substrate. A polymeric substrate may comprise polyester. A polymeric substrate may comprise a release coating.

In accordance with one or more embodiments, a method for producing a film of metal particles may include applying a material comprising metal powder having a $d_{50}$ range of about 0.001 to about 10 micrometers on a substrate, and drying the material on the substrate to form the film.

In some embodiments, the substrate may comprise a polymeric substrate. The step of applying the material may comprise printing or casting the material. In at least some embodiments, the material may be printed in a continuous layer. In other embodiments, the material may be printed to form an array of discrete shapes. In some embodiments, the method may further comprise preparing the material.

In accordance with one or more embodiments, a lamination process for applying a layer of metal particles to a component may include placing the component on a film comprising the layer of metal particles on a polymeric substrate to form an assembly, applying heat to the assembly in a range of about 50 to about 175° C., applying pressure to the assembly in a range of about 0.05 to about 3 MPa, and releasing the component from the assembly, whereby the layer of metal particles remains on the component and separates from the polymeric substrate. In some embodiments, the film may be substantially the same size as the component.

In accordance with one or more embodiments, a method for attachment may include applying a film of metal particles to a substrate, placing a die on the film to form an assembly, applying a pressure of less than about 40 MPa to the assembly, and sintering the assembly at a temperature of about 175 to about 400° C. for about 0.25 seconds to about 30 minutes.

In some embodiments, a pressure of about 0.5 to about 20 MPa may be applied. In at least some embodiments, a pressure of about 2.0 to about 10 MPa may be applied.

In accordance with one or more embodiments, a method for attachment may comprise applying a film of metal particles on a back side of a wafer, dicing the wafer to form a plurality of die, placing at least one die on a substrate to form an assembly, applying a pressure of less than about 40 MPa to the assembly, and sintering the assembly at a temperature of about 175 to about 400° C. for about 0.25 seconds to about 30 minutes. In some embodiments, a pressure of about 2.0 to about 10 MPa may be applied.

In accordance with one or more embodiments, a method for attachment may comprise applying a film of metal particles on a back side of a die, placing the die on a substrate to form an assembly, applying a pressure of less than about 40 MPa to the assembly, and sintering the assembly at a temperature of about 175 to about 400° C. for about 0.25 seconds to about 30 minutes. In some embodiments, a pressure of about 2.0 to about 10 MPa may be applied.

In accordance with one or more embodiments, a method for producing a film of metal particles may comprise applying a material comprising metal powder having a $d_{50}$ range of about 0.001 to about 10 micrometers on a substrate, and drying the material on the substrate to form the film.

In accordance with one or more embodiments, a lamination process for applying a layer of metal particles to a component may comprise placing the component on a film comprising the layer of metal particles on a polymeric substrate to form an assembly, applying heat to the assembly in a range of about 50 to about 200° C., applying pressure to the assembly in a range of about 0.05 to about 10 MPa, and releasing the component from the assembly, whereby the layer of metal particles remains on the component and separates from the polymeric substrate.

In accordance with one or more embodiments, a method for attachment may comprise applying a film of metal particles to a substrate, placing a die or a wafer on the film to form an assembly, applying a pressure of less than about 40 MPa to the assembly, and sintering the assembly at a temperature of about 160 to about 400° C. for about 0.25 seconds to about 120 minutes.

Still other aspects, embodiments, and advantages of these exemplary aspects and embodiments, are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. Where technical features in the figures, detailed description or any claim are followed by references signs, the reference signs have been included for the sole purpose of increasing the intelligibility of the figures and description. In the figures, each identical or nearly identical component that is illustrated in various figures is represented by a like numeral. For purposes of clarity, not every component may be labeled in every figure. In the figures:

FIG. 9 illustrates an example of a die attached by the process of FIG. 8 in accordance with one or more embodiments;

FIGS. 23A and 23B present data in accordance with one or more embodiments discussed in Example 6;

FIGS. 26 and 27 present data in accordance with one or more embodiments discussed in Example 7;

DETAILED DESCRIPTION

Figure 1B:
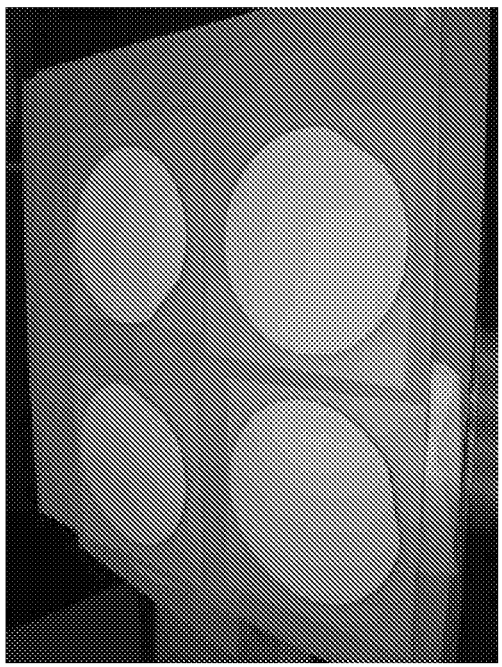
FIGS. 1A-1D illustrate non-limiting examples of a formulation applied to a substrate in accordance with one or more embodiments.
Figure 1D:
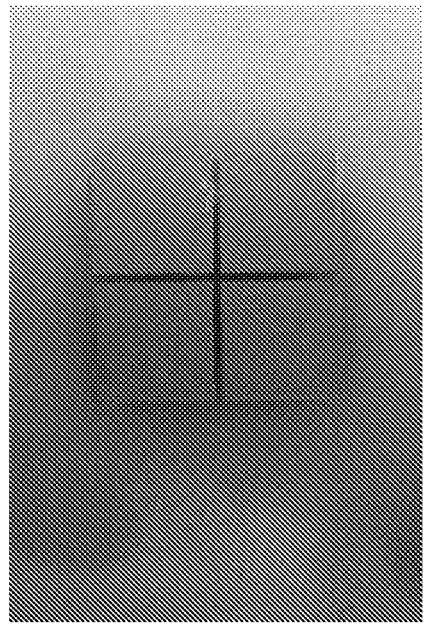
Figure 1A:
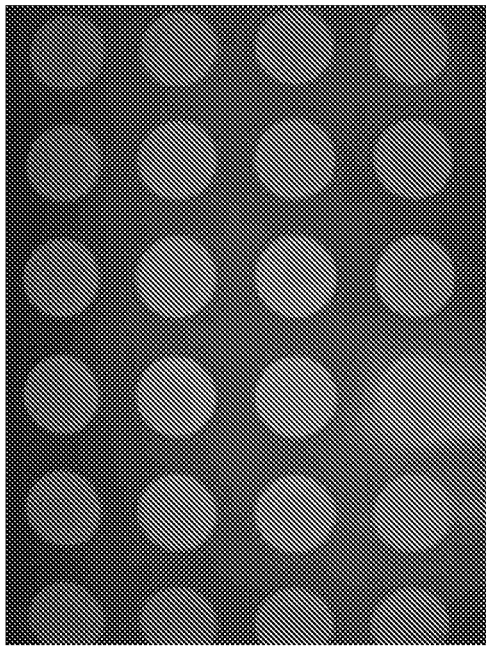
Figure 1C:
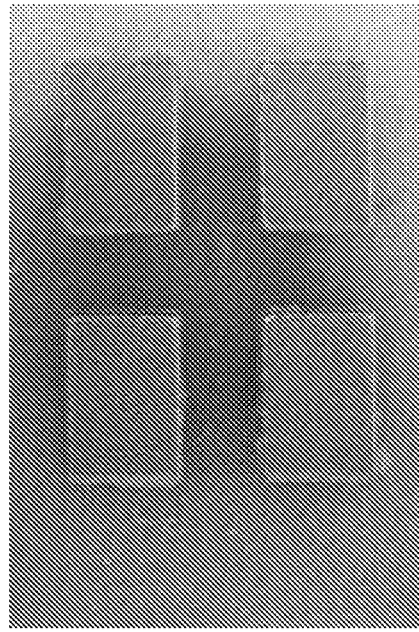

In accordance with one or more embodiments, a first component may be reliably attached to a second component. Some embodiments may involve sintering at a relatively low pressure and relatively low temperature in comparison to conventional sintering processes while achieving substantially the same results. In some embodiments, electronic components may be attached. In other embodiments, non-electronic components may be attached. High thermal and electrical conductivity bonds with high reliability and flexible bond line thickness may be provided. One or more embodiments may promote a substantially uniform bond line thickness subsequent to sintering. Porosity, thermal and mechanical properties may also be substantially uniform. In some non-limiting embodiments, a bond line having a thickness in a range of about 2 microns to about 100 microns may be achieved. Control and uniformity of bond line thickness over both large and small areas may be achieved. In some embodiments, loss of material during processing may be reduced which may result in overall cost savings of at least about 15% to about 20% in comparison to conventional attachment processes. Embodiments may also be associated with lower capital costs. Organic residue may also beneficially be reduced such that post-cleaning may not be necessary. In some embodiments, lead-free bonds are formed without intermetallics. Ease of processing may also be recognized in accordance with one or more embodiments enabling high yield, high throughput manufacturing processes. Various processes for the application of pressure and heat may be enabled. Sintering materials and techniques in accordance with one or more embodiments may find applicability in a variety of industries including hybrid electric vehicles, wind and solar power generation including photovoltaic cells, transportation, industrial applications, consumer electronics and telecommunications.

In accordance with one or more embodiments, a sintering material may be used to facilitate attachment of various components. The sintering material may be used in a variety of forms. In some embodiments, a sintering material may be used directly, for example, as an ink or a paste. In other embodiments, a sintering material may be used for the formation of a sintering film. A sintering film may be used in place of a conventional sintering paste. In some embodiments, a sintering film may be produced by applying a fluid sintering formulation to a substrate and then drying the formulation on the substrate. The film may be subsequently transferred via a lamination process to facilitate attachment of components.

In accordance with one or more embodiments, a sintering material for use in any form may generally include a metal powder, a binder and a solvent. Various metals may be used depending on an intended application. Properties of one or more components to be attached, or one or more process conditions associated with an implemented attachment process such as temperature and pressure, may impact selection of the metal powder for the formulation. Silver, gold, copper, palladium and aluminum are some non-limiting examples of metal powders that may be used. In some embodiments, mixtures of metals may also be used such as silver palladium alloy and gold palladium alloy. In some embodiments, metals, alloys or mixtures of metals and alloys may be used.

In accordance with one or more embodiments, the particle size of the metal powder may vary based on desired characteristics of the formulation for an intended application. In some embodiments, metal powder with a $d_{50}$ range of from about 0.001 to about 100 micrometers may be used. In certain embodiments, metal powder with a $d_{50}$ range of from about 0.001 to about 10 micrometers may be used. In one or more embodiments, metal powder with a $d_{50}$ range of from about 0.001 to about 0.01 micrometers may be used. In some embodiments, the particle size of the metal powder may be on the nanoscale. In some embodiments, the particle size may be about 10 to about 100 nanometers. In still other embodiments, the particle size may be about 10 to about 60 nanometers. In at least one non-limiting embodiment, the particle size may be about 20 nanometers. In some non-limiting embodiments, nanosilver particles may be used.

In certain embodiments, the particles may be highly engineered. In some embodiments, the particles of the metal powder may be coated or capped. Some non-limiting examples of coatings include fatty acids, fatty amines and starch. The amount of coating may constitute about 0.1 to about 20 weight percent of the formulation. In some embodiments, the coating may preferably constitute less than about 1 weight percent of the formulation. In at least some non-limiting embodiments, the coating may constitute about 0.5 to about 0.8 weight percent of the formulation. In other embodiments, the particles of the metal powder may be uncoated or uncapped. Metal particles for the metal powder may be formed by various techniques. In at least one non-limiting embodiment, metal powder for use in the formulation may be produced as described in U.S. Pat. No. 7,968,008 to Parashar et al. which is hereby incorporated herein by reference in its entirety for all purposes. In some non-limiting embodiments, the metal powder may constitute about 30 to about 95 weight percent of the formulation. In at least one specific embodiment, the metal powder may constitute about 80 weight percent of the formulation.

In accordance with one or more embodiments, a binder may provide strength and flexibility to the film subsequent to drying. The binder may also provide adhesion of the formulation to a substrate on which it is deposited to facilitate film formation. The binder may yet also provide adhesion of a film to a substrate to which it is transferred via a lamination process. In some embodiments, various resins or rosins may be used for the binder. Conditions and parameters associated with lamination and attachment processes to be used may impact binder selection. In some non-limiting embodiments, the binder may have a softening point of between about 50° C. and about 170° C. In one non-limiting embodiment, a binder with a softening point of about 90° C. may be used, such as Foralyn™ E partially hydrogenated rosin ester commercially available from Eastman. In at least one embodiment, the binder may constitute about 0.5 to about 5 weight percent of the formulation.

In accordance with one or more embodiments, the formulation may also include one or more functional additives. Additives may generally improve adhesion to a substrate and the sintering behavior of the material. Non-limiting examples of additives include organic acids, amines, chlorinated or brominated diols or metallorganic compounds, such as silver metallorganic compounds. Others may be commonly known to those skilled in the art. In some non-limiting embodiments, functional additives may constitute about 0.1 to about 2 weight percent of the formulation.

In accordance with one or more embodiments, various solvents may be used to dissolve the binder and any additives present in the formulation. Various solvents such as but not limited to alcohols, diols, glycols or combinations thereof may be used. In some embodiments, terpineol may be a preferred solvent. In other non-limiting embodiments, a mixture terpineol and butyl carbitol may be used. In still other non-limiting embodiments, a mixture of terpineol, butyl carbitol and isopropanol may be used. The amount of solvent present may vary depending on desired properties, such as viscosity, of the resulting formulation. Desirable viscosity may depend on intended use, such as a selected deposition technique. For example, a printing approach may require a lower viscosity such that the formulation may exhibit one or more characteristics typical of an ink. Spraying may also be associated with a lower viscosity. Other deposition techniques, such as typecasting, may generally be associated with higher viscosity formulations. In some embodiments, higher viscosity formulations may exhibit one or more characteristics typical of a paste. In embodiments where it is desirable to form a sintering film from the formulation, viscosity may be adjusted accordingly to facilitate that process. Loading of the metal powder, binder and/or additives with respect to the solvent system may generally be adjusted to manipulate viscosity or another physical characteristic. In some non-limiting embodiments, the viscosity of the formulation may be in a range of about 10 to about 200,000 cP. In at least one specific non-limiting embodiment, the viscosity may be about 800 cP at 25° C.

In accordance with one or more embodiments, the formulation may be prepared by mixing the components. Various mixing devices and techniques known to those skilled in the art may be implemented, such as a planetary mixer, orbital mixer or ultrasonic mixer. Milling may also be performed in some embodiments, for example, so as to ensure a desired texture. In some embodiments, the formulation may be used directly in a sintering process. For example, the formulation may be applied directly to a component. In other embodiments, the formulation may be a precursor to a sintering film. A film may be used as a substitute for a paste in a sintering assembly process.

In accordance with one or more embodiments, the formulation may be applied to a backing layer or substrate and then dried to form a film. The substrate should generally provide adequate adhesion and support to a dried film for easy and reliable handling. The substrate may be rigid or flexible. The thickness of the substrate may vary. In some non-limiting embodiments, the substrate may be between about 35 microns and about 75 microns in thickness. The substrate should also release the film readily, such as during a lamination process. The substrate should generally not be affected by solvents in the formulation and should be stable at film drying and subsequent lamination temperatures. In some embodiments, the substrate may be a polymeric substrate. In at least one non-limiting embodiment, the substrate may be a polyester substrate. In other embodiments, a glass, metal, paper or ceramic substrate may be used. In some embodiments, the substrate may have a release layer or coating. In some embodiments, materials such as silicone or aluminum may be used as a substrate or a substrate coating. In at least one non-limiting embodiment, the substrate may be a polyester film with a silicon release coating commercially available from Saint-Gobain. In some embodiments, the substrate may be intended to facilitate tape-and-reel dispensing during an assembly operation.

In accordance with one or more embodiments, the formulation may be applied to the substrate for film formation using various techniques known to those skilled in the art. In some embodiments, a printing technique may be used. Non-limiting examples of printing techniques include inkjet, pad, screen, stencil, tape caster, gravure and offset printing. Other deposition methods may include recasting and spray techniques. As discussed above, one or more physical properties of the formulation may be adjusted based on an intended deposition technique. Deposition of the formulation may be continuous over substantially an entire surface of the substrate or may be in discrete shapes with respect to the substrate surface. In some non-limiting embodiments, the formulation may be applied on the substrate in shapes and/or sizes corresponding to dimensions of a component, such as a die, to be attached using the resulting film. Any geometry and any dimensions may be implemented. Some non-limiting embodiments of the formulation applied to a substrate are illustrated in FIGS. 1A-1D. In some non-limiting embodiments, rounds with a diameter of about 0.1 to about 500 millimeters may be deposited. In other non-limiting embodiments, rectangles having a length or width of about 0.1 to about 500 millimeters may be deposited on the substrate. In at least some embodiments, the formulation may be applied in a pattern on the substrate. In some non-limiting embodiments, the shapes and sizes applied to a substrate may be intended to facilitate tape-and-reel dispensing during an assembly operation.

After deposition, the applied formulation may be dried on the substrate, such as in a batch or continuous oven. In some non-limiting embodiments, the deposited formulation may be dried at a temperature of around 130° C. for about 30 minutes. Dry thickness of the resulting films may vary depending on the deposition technique and the intended application. Dry thickness may be from about 5 to about 1000 microns in accordance with one or more non-limiting embodiments. In some non-limiting embodiments, films may have a dry thickness of about 5 to about 300 microns. In some embodiments, films may be free standing. For example, films having a dry thickness of from about 100 to about 300 microns may be removed from the substrate and used as free standing films for subsequent lamination and attachment in accordance with one or more embodiments. In other embodiments, and in the case of relatively thinner films, the substrate may remain intact with respect to the film until removal during a lamination process.

In accordance with one or more embodiments, a film may be used as a substitute for a paste in a sintering assembly process. In some embodiments, using a film may enable different processes for applying heat and pressure in an assembly process, such as in a sintering process. In at least some embodiments, using a film may remove at least one process step in an assembly operation. As discussed below, a sintering film may be applied to a workside or on a substrate side to facilitate assembly. With respect to the workside, a wafer may be laminated and then diced to form a plurality of laminated dies in accordance with one or more embodiments. In other embodiments, a wafer may first be diced followed by lamination of individual die.

In accordance with one or more embodiments, a first step in an attachment process may be lamination of a film to either a component or a substrate. During lamination, a sintering film may be applied to a die, device, wafer, substrate, direct bonded copper (DBC), lead frame, metal disc or other element. A laminated component may subsequently be attached to a substrate. A laminated substrate may subsequently receive one or more components. A film may be adhered to a backing layer as described above with respect to film formation to facilitate lamination. In some embodiments, the film may be a blanket film much larger in dimensions when compared to the element being laminated. In other embodiments, the film may be generally patterned to be the substantially the same size as or smaller than the element being laminated. In at least some embodiments, the film may contain one or more deposits located in a specific pattern for use in a specific application that is then transferred via lamination. Lamination may generally be performed via a transfer or a stamping process. It is generally desired to avoid sintering of the film during lamination.

In a transfer approach, a film may be laminated to a substrate which will subsequently receive one or more components. During a transfer approach, a film may be placed on a substrate, for example, a direct bonded copper (DBC) substrate, silicon wafer substrate, heat spreader or piezoelectric substrate. The film may be pressed using a roller or other appropriate equipment such as a press laminator to form an assembly. Heat and pressure may then be applied. Heat and pressure may be applied simultaneously or sequentially. In some non-limiting embodiments, the assembly may be subjected to a temperature of about 50° C. to about 175° C. In at least one non-limiting embodiment, a temperature of about 130° C. may be used. Heat may be applied using various known techniques including infrared, induction, conduction, convection, radiation, and ultrasonic. In some non-limiting embodiments, a heated placement tool or heated platen may be used. In some non-limiting embodiments, the assembly may be subjected to a pressure of about 0.05 to about 3 MPa. In at least one embodiment, a pressure of about 0.2 to about 1 MPa may be used. The heat and pressure may generally be applied for a relatively short period of time, such as less than about a minute. In some specific embodiments, heat and pressure may be applied for about 10 to about 60 seconds.

Figure 2:
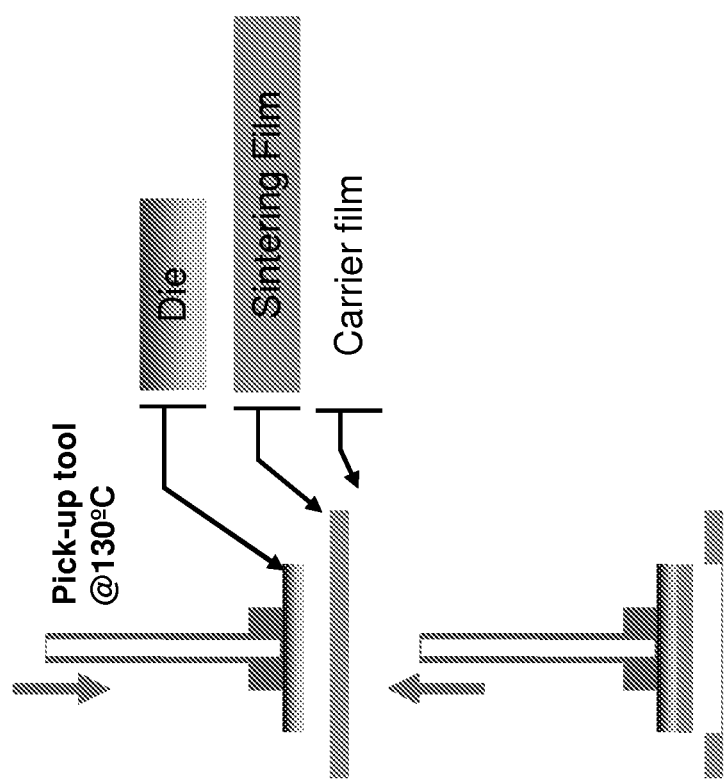
FIG. 2 illustrates a stamping process in accordance with one or more embodiments.

In a stamping approach, a film may be applied to a component, such as a wafer or a die of various sizes. A stamping process is illustrated in FIG. 2. Equipment known to those skilled in the art such as a die placement machine may be used to facilitate lamination. In at least some non-limiting embodiments, the film may be attached to a backside of the component. Heat and pressure in the ranges noted above may then be applied for a relatively short period of time. In one non-limiting embodiment, first and second platens may be heated to about 130° C. A pressure of about 1 MPa may be applied. Die size may impact a desired force applied. Dwell time may depend on the duration needed to generally heat the assembly through. In some non-limiting embodiments, dwell time may be about 3 minutes. In some non-limiting embodiments, dwell time may be about 20 to about 100 milliseconds.

Figure 3:
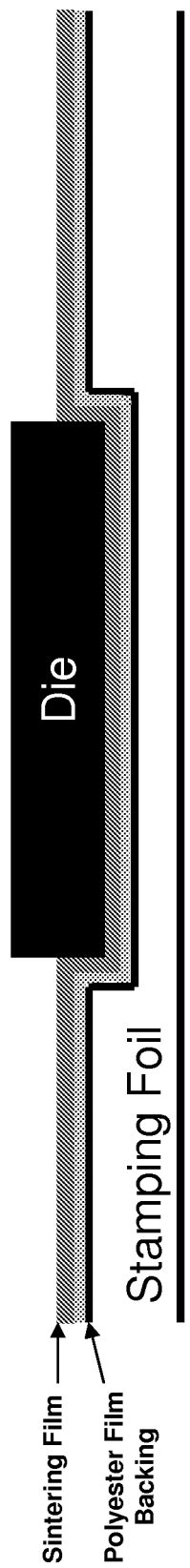
FIG. 3 illustrates a stamping support in accordance with one or more embodiments.

A support may be used to facilitate lamination during a stamping process. Rubber pads, etched foils, structures with cavities or other materials may be used for support. In some embodiments, the supporting structure may create a cutting action to stamp out a portion of the film from the backing layer. In some non-limiting embodiments, a stainless steel cavity etched foil may be used as a stamping support. The foil may have any desired thickness and any desired space between cavities that may ensure good repeatability and strength of the remaining film. FIG. 3 presents the concept of the stamping support using a stamping foil as an example.

Figure 4:
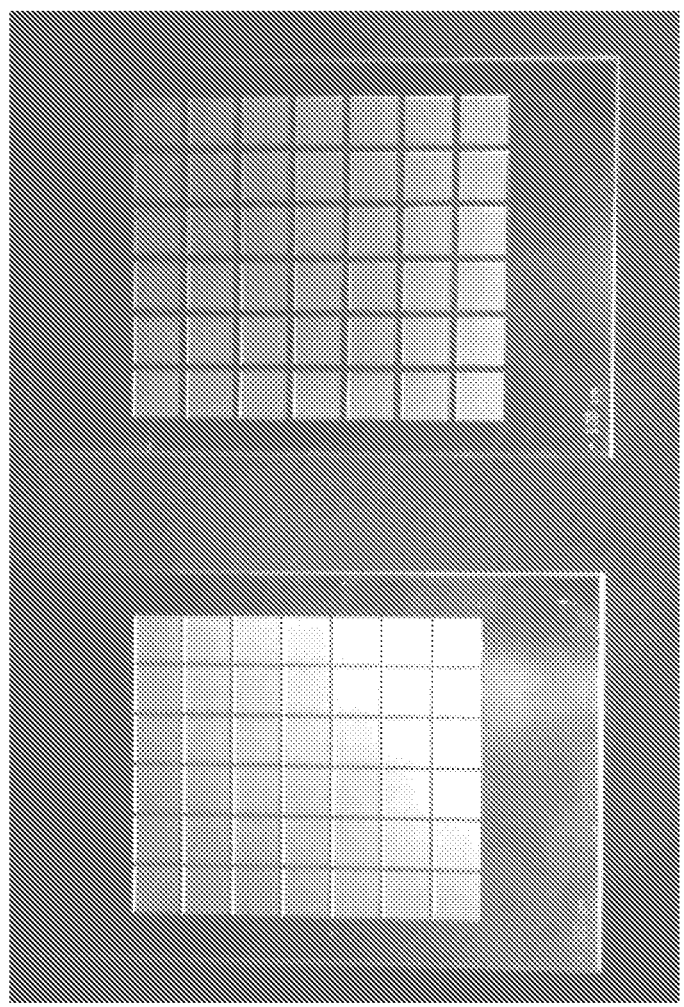
FIG. 4 illustrates examples of stamping foils in accordance with one or more embodiments.

FIG. 4 presents examples of foils having 1 mm and 2 mm spaced cavities, respectively. In other embodiments, a rubber pad, such as a silicone rubber pad may be used as a stamping support. The thickness of the pad may vary and in some non-limiting embodiments may be about 3 mm thick. In still other embodiments, a hard substrate like epoxy or plastic or metal plate may be used for support. The support may also function to protect the assembly and/or avoid adhesion to equipment during processing. The optimal tooling may depend on die area and other factors. For example, a rubber or foil support may be better for one application than another. A system to hold the film down during stamping may be used to facilitate the operation and may help protect the film during the operation.

Figure 5:
FIG. 5 illustrates a die lamination process in accordance with one or more embodiments.

A non-limiting example of a stamping process for die lamination is illustrated in FIG. 5 using a Datacon 2200 EVO die bonder. The bonder picks up the die from the die holder or dicing tape. The die holding tool is heated to about 130° C. The die is then placed on a silver film with about 50N force. As a result, a portion of the film having dimensions substantially the same as those of the die is laminated on the back side of the die. The laminated dies are then collected into a waffle pack for further attachment, such as via sintering, to a DBC substrate or lead frame.

In some embodiments, a laminated component may be baked to complete the lamination process. In some non-limiting embodiments, a laminated component may be baked for about one hour at about 130° C. Upon completion of the lamination process, for example the transfer or stamping process, the backing layer to which the film was adhered may be removed. The laminated substrate or component may now include a deposited film of metal particles. In some specific embodiments, the film may be a film of nanometal particles. In at least one non-limiting embodiment, the film may be a film of nanosilver particles. As noted above, the backing layer may alternatively be removed to produce a free-standing film prior to lamination in accordance with one or more embodiments, such as those involving a relatively thicker film.

In accordance with one or more embodiments, a layer of sintering material, such as a film or paste, may be deposited on a die side. In other embodiments, a layer of sintering material may be deposited on a substrate side. In some non-limiting embodiments, the sintering film or paste may include silver particles, such as silver nanoparticles. A nanosilver material, for example, may begin to sinter at temperatures above about 130° C. A sintering material may function to create a highly reliable bond, for example, between a substrate and an element such as a die, device or other object. Pressure may be applied either simultaneously with heat, or prior to heating to the sintering temperature. If pressure is applied after heating, one or more benefits of the sintering material, for example, low pressure sintering, fast sintering times, or the ability to form a reliable bond, may be lost. In at least some embodiments, for multichip devices, chip placement and sintering may be performed in two different process steps. Applying the sintering material to the substrate may impose limitations on the process for single die packages and multichip packages. For example, the substrate should be kept below the sintering temperature before pressure and heat are applied. Rapid heating of the substrate may be desirable for high speed production. Considering that the substrate may typically be the largest thermal mass, this may slow the process cycle time. In accordance with one or more embodiments, applying the sintering material to the die side of the assembly may enable the substrate to be heated to sintering temperatures and may reduce process cycle times. Placement and sintering may be performed in one process step while the substrate is at sintering temperatures. Electronic and non-electronic components may be attached in accordance with one or more embodiments.

In accordance with one or more embodiments, a laminated component may be bonded or attached to a substrate. The laminated component may, for example, be a die, device, wafer, or other element. The substrate may, for example, be a DBC, lead frame, metal disc, or other element. During bonding, the laminated component may generally be brought in contact with the substrate to form an assembly. Heat and pressure may be applied to the assembly for a sufficient duration to form a bond between the component and the substrate. The bond should generally have one or more desired characteristics such as those relating to strength, uniformity and bond line thickness. In some non-limiting embodiments, applied heat and pressure may be maintained for about 0.25 seconds to about 30 minutes. Such durations may in some embodiments be associated with process or cycle times more than four times faster than conventional sintering processes. A pressure of between about 0.5 MPa and 20 MPa may be applied in one or more non-limiting embodiments. In some non-limiting embodiments, a sintering pressure of about 5 to about 10 MPa may be used. Such pressures may be as much as 25 times less than conventional sintering techniques and may beneficially lessen stress on components, substrates and process equipment. A temperature of between about 175° C. and 400° C. may be applied in one or more non-limiting embodiments. In some non-limiting embodiments, a sintering temperature of about 230° C. to about 260° C. may be used. In some embodiments, the heat may be applied by heating a placement tool, weight, spring, or mass used for placing, holding, or placing and holding the component. In other embodiments, heat may be applied via a continuous or batch oven, or by heating a platen located beneath the substrate or above the component. In some embodiments, both the placement tool and a platen or multiple platens located above and/or below the assembly may be heated. Heat may be applied via infrared, induction, conduction, convection, radiation, ultrasonic, or other technique. Multiple laminated components may be bonded to a single substrate or multiple substrates in a serial or a parallel approach. In at least one non-limiting embodiment, sintering may be performed at a temperature of about 200° C. for about 15 minutes.

In accordance with one or more embodiments, a component may be bonded or attached to a laminated substrate. The component may, for example, be a die, device, wafer, or other element. The laminated substrate may, for example, be a DBC, lead frame, metal disc, or other element. During bonding, the component may generally be brought in contact with the laminated substrate to form an assembly. Heat and pressure may be applied to the assembly for a sufficient duration to form a bond between the component and the substrate. The bond should generally have one or more desired characteristics such as those relating to strength, uniformity and bond line thickness. In some non-limiting embodiments, applied heat and pressure may be maintained for about 0.25 seconds to about 30 minutes. A pressure of between about 0.5 MPa and 20 MPa may be applied in one or more non-limiting embodiments. In some non-limiting embodiments, a sintering pressure of about 5 to about 10 MPa may be used. Such pressures may be as much as 25 times less than conventional sintering techniques and may beneficially lessen stress on components, substrates and process equipment. A sintering temperature of between about 175° C. and 400° C. may be applied in one or more non-limiting embodiments. In some non-limiting embodiments, a sintering temperature of about 230° C. to about 260° C. may be used. In some embodiments, the heat may be applied by heating a placement tool, weight, spring, or mass used for placing, holding, or placing and holding the component. In other embodiments, heat may be applied via a continuous or batch oven, or by heating a platen located beneath the substrate or above the component. In some embodiments, both the placement tool and a platen or multiple platens located above and/or below the assembly may be heated. Heat may be applied via infrared, induction, conduction, convection, radiation, ultrasonic, or other technique. Multiple components may be bonded to a single laminated substrate or multiple laminated substrates in a serial or a parallel approach. In at least one non-limiting embodiment, sintering may be performed at a temperature of about 200° C. for about 15 minutes.

In some embodiments, equipment for attachment of multiple components may be a hydraulic or pneumatic press, such as one manufactured by Carver Inc. A typical press may have a large heating platen to accommodate a large number of substrates. The platen may provide heat of about 200 to about 300° C. and the press may be capable of providing force sufficient to generate a pressure of about 1 to about 20 MPa on attached components. An example of one such press is the Carver MH 3891 press. For attachment of a single die or component, equipment such as an ESEC soft solder die bonder SSI 2009 may be used. The bonder may be capable of applying a bonding force of about 100N and heat up to about 400° C.

In accordance with one or more embodiments, the sintering process may convert the metal particles in the sintering material to bulk metal. Without wishing to be bound by any particular theory, upon onset of the sintering process, nanoparticles may convert to micron particles and then convert to bulk metal through grain growth and densification as temperature and time increases, even without applied pressure. A dense metal film may be formed with strength comparable to bulk metal.

In accordance with one or more embodiments, following any of the sintering processes described above, assembled parts may be post-treated in the oven, for example, at about 300° C. for about 5 to 10 minutes. Such post-sintering may result in improved strength of assembly joints. Use of post-sintering may also minimize overall process sintering time and increase throughput of the sintering press.

In accordance with one or more embodiments, resulting bonds may be associated with high thermal and electrical conductivity. Non-limiting examples of silver bond lines may have a thermal conductivity in the range of approximately 250 W/m° K. Some non-limiting examples of silver bond lines may have a density of about 85 to about 95% of bulk silver. The bonds may also be associated with high thermal shock resistance which may contribute to extended die bond life. In some embodiments, bonds may exhibit more than 40 MPa bond strength (die shear) over more than 2000 cycles at 220° C. In at least some embodiments, No delamination may occur even after 800 thermal shock cycles at 220° C.

In accordance with one or more embodiments, silver may be appropriate for high temperature packing applications because of its high electrical and thermal conductivity, low susceptibility to oxidation, and melting point that is sufficient to withstand high operating temperatures. In some embodiments, a silver bond may be more than five times more reliable than solder.

In accordance with one or more embodiments, sintering materials and techniques may be useful in the attachment of Si, SiC, GaN or other semiconductor devices.

Figure 6:
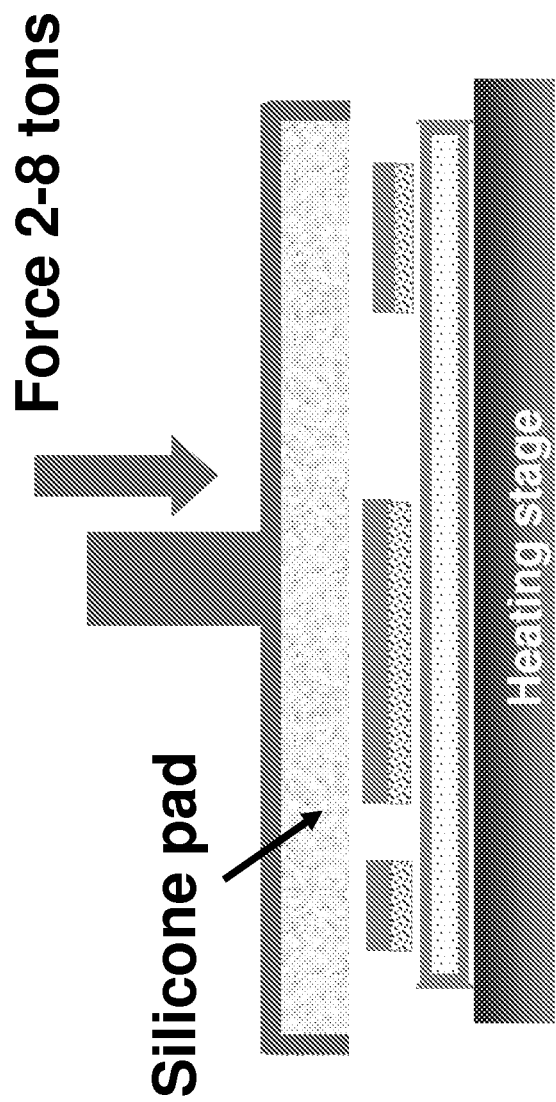
FIG. 6 presents a schematic of a die attachment approach in accordance with one or more embodiments.

In accordance with one or more non-limiting embodiments, components such as semiconductor devices may be attached to a substrate using a metal paste rather than a film. FIG. 6 presents a schematic of one non-limiting approach to die attachment using low temperature and low pressure. In the process, a metal paste may be printed on a substrate. Various pastes may be used. In some non-limiting embodiments, the metal paste may be a nanometal paste such as a nanosilver paste. In one non-limiting example, a silver paste commercially available from Alpha Metals Inc., such as one containing silver nanopowder and an organic vehicle, may be used. Various substrates may be used, such as bare copper lead frames, or copper lead frames including a silver or gold coating. Ceramic substrates and DBC may also be used. Various dies, such as those involving silicon, silicon carbide or any other chips or devices may be used.

In accordance with one or more embodiments, a die attach process may involve printing on a substrate, such as on a lead frame. In such embodiments, printing paste on the substrate may be achieved by various techniques including stencil/screen printing or by dispensing. The substrate may be any desired material, such as a copper based material or a metallized ceramic, for example, DBC. The attachment process illustrated in FIG. 6 may include non-limiting steps of printing paste on a substrate, drying the paste, for example at 130° C., placing a die on the printed paste, placing the die-substrate assembly on a heating stage, applying pressure, raising the temperature to about 250° C. to about 300° C., and holding the pressure and temperature for about 30 to about 90 seconds.

Figure 7B:
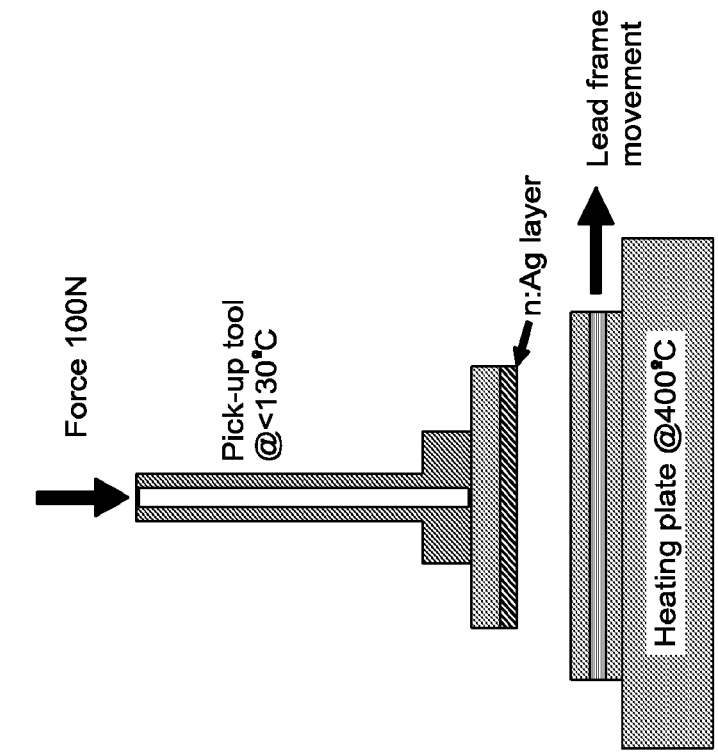
FIGS. 7A and 7B illustrate non-limiting examples of deposition techniques in accordance with one or more embodiments.
Figure 7A:
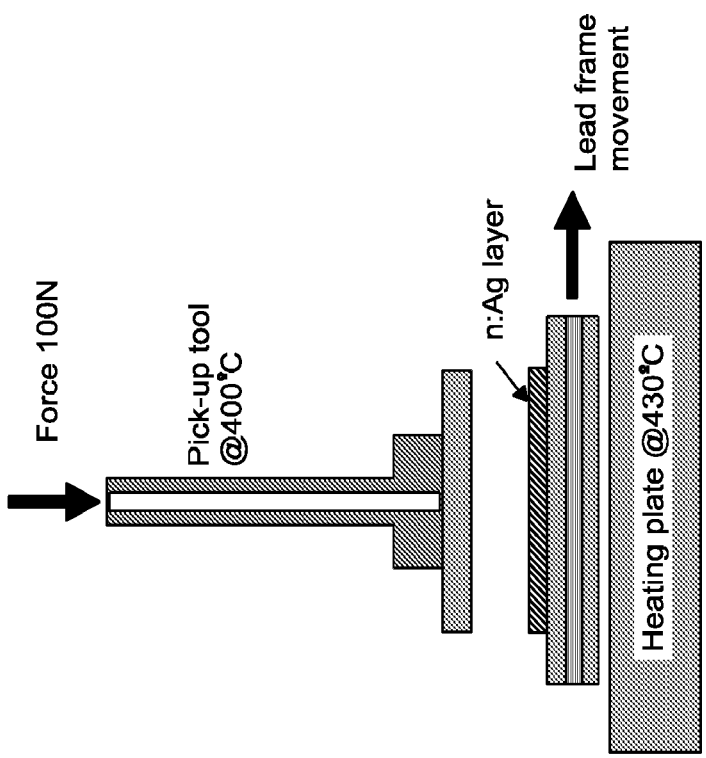

In accordance with one or more embodiments, a die attach process may use standard soft solder die bonder equipment. A pick-up tool may pick a die from a dicing tape and place it with a force onto a heated substrate. Paste, such as silver paste, may be printed either on the substrate or on the back side of an individual die, entire wafer or applied as a film. The deposition may be performed by print or applied as a film via lamination. Examples of non-limiting processes in accordance with one or more embodiments are shown schematically in FIGS. 7A and 7B. FIG. 7A illustrates printing on the substrate while FIG. 7B illustrates printing on the backside of the component.

In accordance with one or more embodiments, a die attach process may involve printing on a substrate via dispensing printing. Silver paste such as a nanosilver paste may be dispensed on a lead frame and then attachment may be performed in a manner similar to that described above. Dispensing techniques may not produce a substantially flat surface comparable to that produced by stencil or screen printing. Various types of dispensing equipment are available for industrial and laboratory use.

In accordance with one or more embodiments, a die attach process may involve printing on the back side of a die, such as a wafer. In accordance with one or more embodiments, paste, such as nanosilver paste may be applied the back side of a wafer in various ways. In some embodiments, nanosilver paste may be applied to the back side of an entire wafer and then the wafer may be diced into individual chips. In other embodiments, the wafer may be diced first and then paste may be applied to the back side of individual chips.

In accordance with one or more embodiments, paste may be applied on the back side of an entire wafer. The paste may be dried after application. In some non-limiting embodiments, the paste may be dried at about 130° C. for about 30 to 90 minutes. A reinforcing solution may be applied, such as by spraying or spin coating. The wafer may then be placed on a dicing tape and the wafer may be diced. The diced wafer on the tape may be introduced to a soft solder die bonder. Individual die may be picked-up and placed on a substrate with force, such as that sufficient to produce a pressure of about 5 to 10 MPa. Heat, such as at a temperature of about 250 to 400° C. may be applied. The pressure may be held, such as for sintering, for about 0.5 to 1 second. Post-sintering may also be performed, such as at a temperature of about 250 to 300° C. for about 10 to 30 minutes.

In accordance with one or more embodiments, an important factor in the attachment process is the ability of a printed paste layer to withstand dicing and a pick-up process without damage. Without sintering, a printed silver layer may be marginally strong and its adhesion to the back side of a wafer may be weak. Without proper strength, a silver layer may be destroyed by dicing and/or during a die pick-up step. To reinforce a silver layer after printing and drying, a solution containing a polymer or resin may be sprayed or spin coated over the sliver layer. After drying, this overcoat may ensure silver layer strength and adhesion to the wafer. It is desirable that the polymer and/or resin will decompose during a later sintering step in order to minimize the effect of any residue on the properties of the sintered silver layer. Non-limiting examples of polymers and resins which may be used include PMMA, PVP, Joncryl 682, and hydrogenated rosins. In some embodiments, certain resins, such as hydrogenated rosins or like materials, may be incorporated into the composition of the silver paste. Application of the reinforcing solution may be optional, whether or not such materials are incorporated into the paste formulation.

In accordance with one or more embodiments, silver may be printed in the form of bumps rather than as a continuous film. Bumping is conventionally used with various devices such as semiconductor chips including memory or processors. Applied bumps are typically in the range of about 80-150 microns in diameter and made of solder. In accordance with one or more embodiments, solder may be replaced with silver for high thermal conductivity and heat dissipation.

Figure 8:
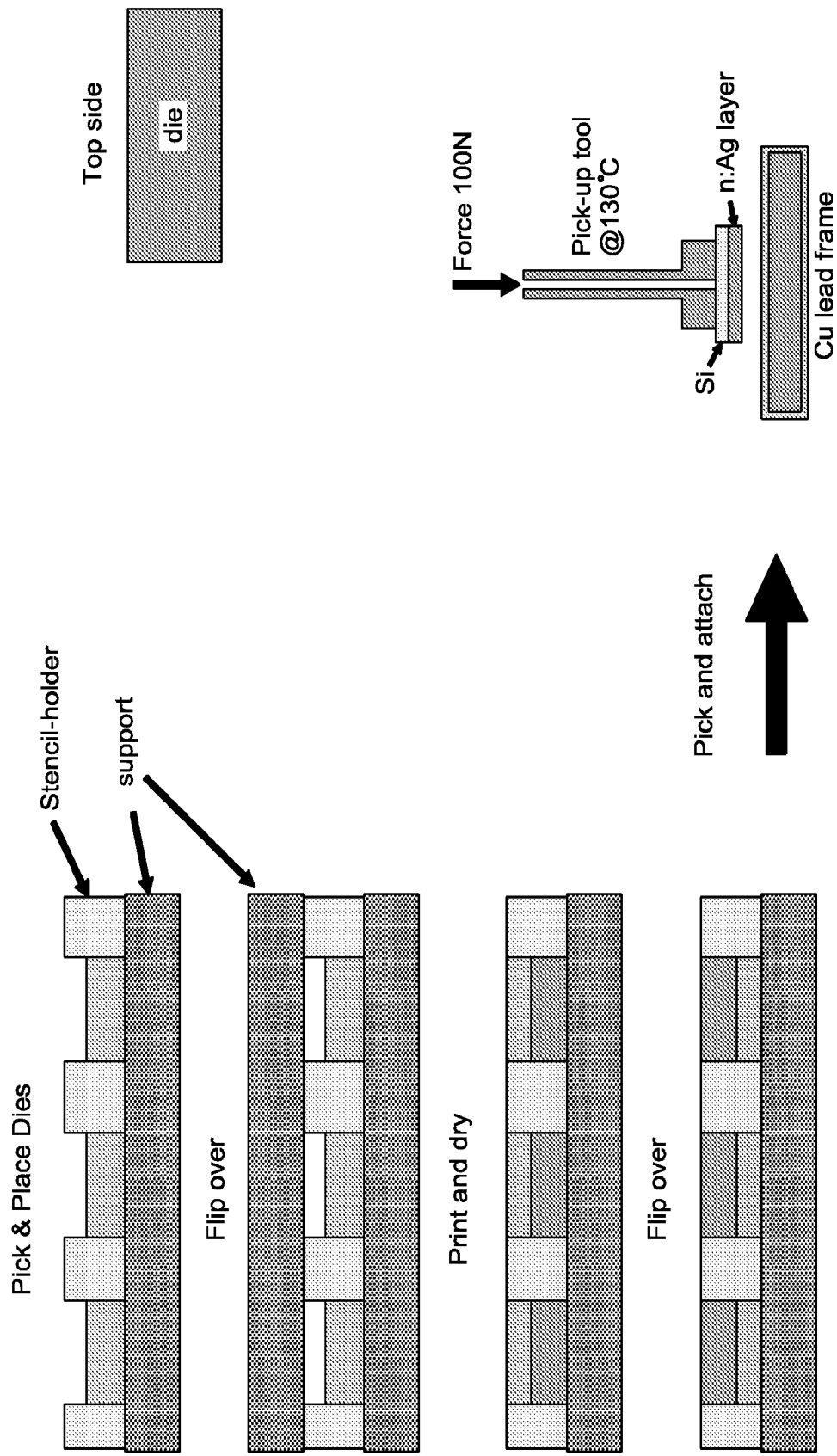
FIG. 8 illustrates a process of printing on a back side of a die in accordance with one or more embodiments.
Figure 10:
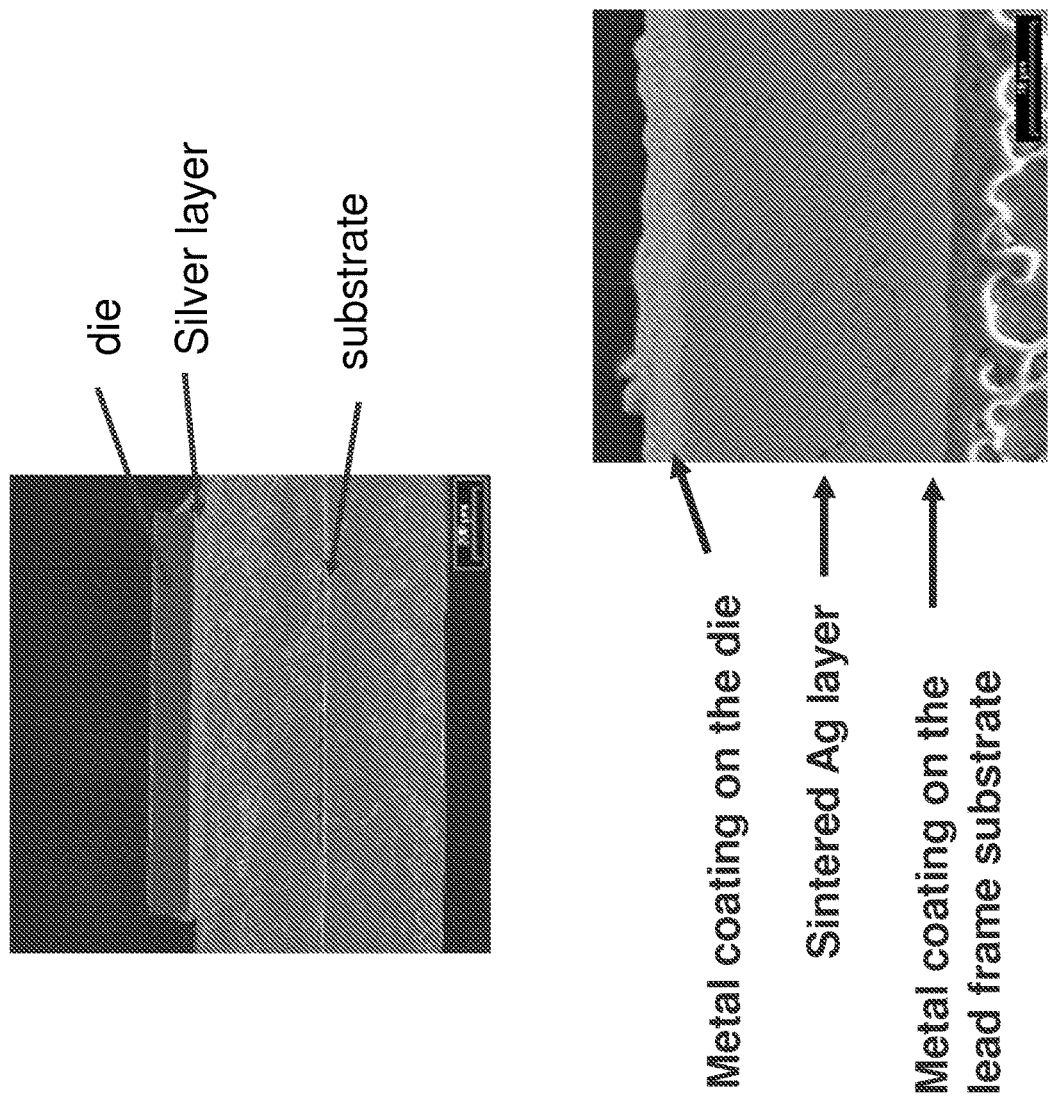
FIG. 10 illustrates a cross-sectional view of the attachment of FIG. 9 in accordance with one or more embodiments.

In accordance with one or more embodiments, paste may be printed on the back side of individual dies. One non-limiting embodiment of this process is schematically shown in FIG. 8. The dies may be picked from dicing tape and placed in a stencil-holder. The thickness of the stencil holder may generally be equal to the thickness of the die plus the printing thickness. The holder may be flipped to expose the back side of the dies. Nanosilver paste may then be printed on the back side. The paste may be dried, for example at 130° C. for about 30 minutes. The stencil-holder may then be flipped to expose the top side of the dies. The dies may then be individually picked up and placed on a substrate. The substrate may be preheated, such as up to a temperature of about 400° C. In some embodiments, the dies may be placed with a force sufficient to produce a pressure of about 5 to 20 MPa. In at least one embodiment, the pressure may be held for about 0.5-2 sec. FIG. 9 presents an example of a die attached by the process of FIG. 8. FIG. 10 presents a cross-sectional view of the attachment, indicating a fully sintered silver layer connected to the metallization on the die and the metallic substrate.

Figure 11:
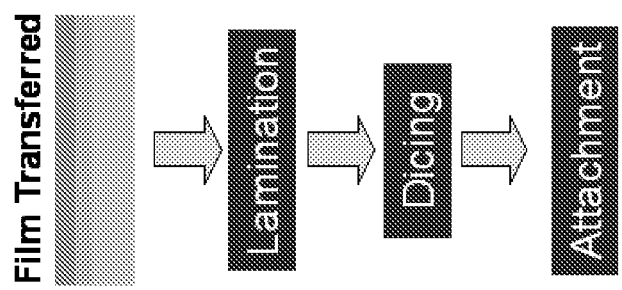
FIG. 11 illustrates a process for transferring a film in accordance with one or more embodiments.
Figure 12C:
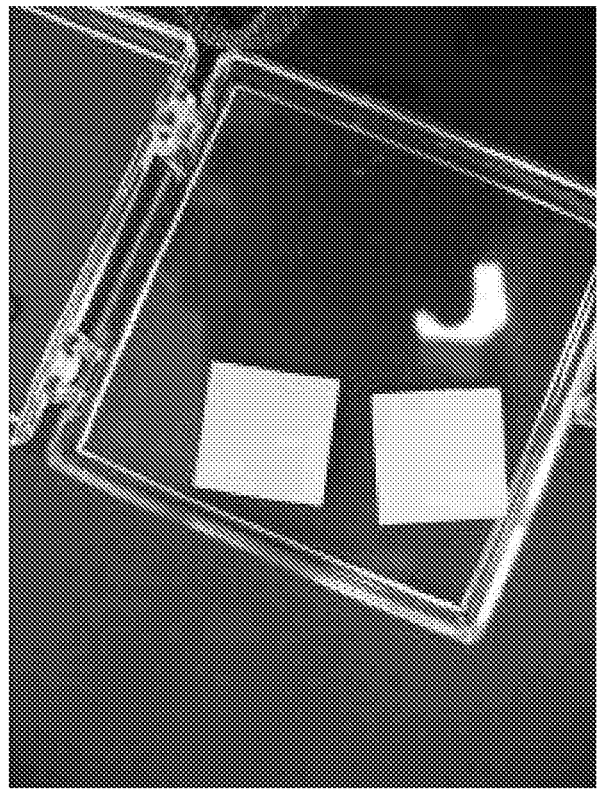
FIGS. 12A-12C present examples of films in accordance with one or more embodiments.
Figure 12A:
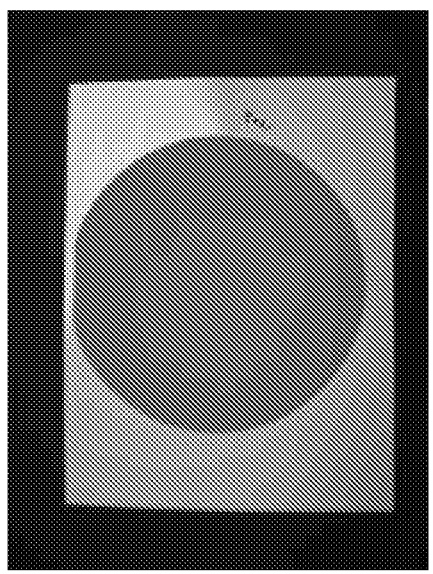
Figure 12B:
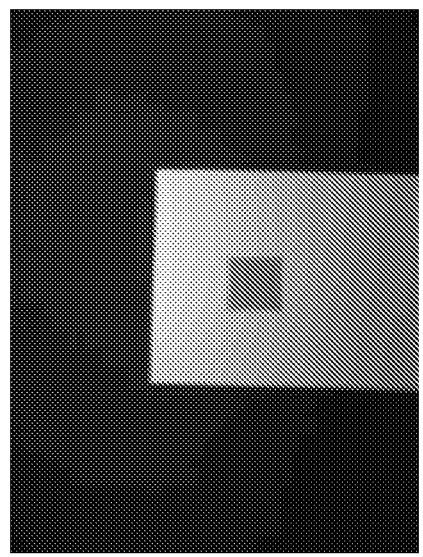

In accordance with one or more embodiments, films may be fabricated and transferred to a wafer, die or substrate. Nanosilver films may be fabricated using specially formulated nanosilver inks, pastes or dispersions. Such formulations may include nanosilver powder, solvents and binders. Films may be made by depositing the formulations on a substrate and drying the formulation at room or elevated temperature. Typical substrates may involve polymer, mylar, paper and aluminum foils. The films may be deposited on the substrate using printing, doctor blade or spraying. The films may be continuous and/or patterned to a desired geometry. The films may be deposited on a flexible or rigid carrier. The printed films may typically be dried in an oven, such as at about 70° C. to 130° C. for about 10 to 40 minutes. The carrier may then be removed and free standing films may be created. Fabricated films may be transferred to a wafer, die or a substrate using a transfer process by applying heat and pressure. Applied pressure may typically be in the range of about 0 to 2 MPa or higher, and applied temperature may be in the range of room temperature to about 150° C. The wafer, die or substrate may then be attached using any known sintering technique, including the attachment processes described above. A non-limiting example of a process for transferring a film onto a wafer is schematically shown in FIG. 11. FIGS. 12A and 12B present examples of printed films and FIG. 12C illustrates free-standing nanofilms.

A film may be transferred onto an individual die, component or heat spreader under the process conditions described above. A component may be introduced to a continuous or patterned film via a common pick and place tool. The film may adhere to the back side of the component which may then be introduced to a final sintering process. In the case of a continuous film, the portion of the film that will be transferred will generally equal the dimension of the component. For sintering multiple dies simultaneously, the dies or components containing applied film may be temporarily tacked to a substrate and then sintered by any method described above. Nanofilms may be formed using any nanometal powder. Nanofilms may include various functional additives to improve desired physical and/or mechanical properties and may be considered as "composite" nanofilms.

In accordance with one or more embodiments, nanosilver and/or other metals may be used for die attach. A continuous film of paste may be stencil or screen printed. Spin coating, spray coating, doctor blading or casting may also be used. In some embodiments, silver may be printed in the form of bumps, such as 50-200 microns in size. The film or bumps may be transferred. A film of nanosilver paste may be applied to an entire wafer prior to dicing. A film may be applied as a step in dicing, or applied after wafer fabrication is completed. Paste and particles may be formulated with a specific composition and properties so as to promote adhesion to the wafer, adhesion to the dicing film, and cohesion between particles. Formulations may also facilitate drying and storage, as well as not inhibit the sintering process and bonding process required for application. In order to facilitate dicing, pressure may be applied to the printed nanosilver layer to enhance cohesion and adhesion to the wafer. Dicing may be enabled using stencils to produce dicing kerfs for saw blades, as well as by reinforcement of die adhesion to dicing tape during dicing. Sintering may be enabled using any form of heat including convection, radiant, induction and microwave. Rapid sintering, such as less than one minute, may be enabled. Slow sintering, as well as sintering combined with diffusion may also be used. Application of silver paste on the die side may provide little or no temperature limitation from the rubber side, as well as little or no temperature limitation from substrate side. Application of silver paste on the die side may also enable attachment done by a hard tool and may generally provide a broader process window. In some embodiments, wafer to wafer bonding may be performed, as well as other bonding applications including wire bonding, ribbon bonding, hermetic sealing, lld sealing, metal to metal bonding, metal to glass bonding, general bonding and bonding to various polymeric materials.

In accordance with one or more embodiments, sintered pastes, such as silver pastes, may be used in conjunction with all types of flip chip devices and assemblies. The materials involved, including powders and pastes, may be specifically designed and formulated for use in flip chip applications. In some embodiments, fine feature printable, sinterable pastes may include nano or micron scale particles of, for example, Ag, AgCu, AgMo, AgNi, and AgSn, with or without one or more metal organic compounds and rheology modifiers.

In accordance with one or more embodiments, a silver film may be applied to a flip chip device. These techniques may generally involve a fine feature pattern printed on a carrier sheet. The carrier sheet may, for example, be made of a material such as mylar or polyester. The patterned film may be transferred to a back side of a die. Alternatively, the pattern may be stencil printed directly on the back side of a diced wafer. Both processes may generally involve a fine feature printable sinter paste. In accordance with one or more embodiments, no pressure may be required for sintering. Instead, pressure may be applied only during placement. Beneficially, there is no need for sharp edges of the dies or pads to define the applied film or paste pattern.

Figure 24:
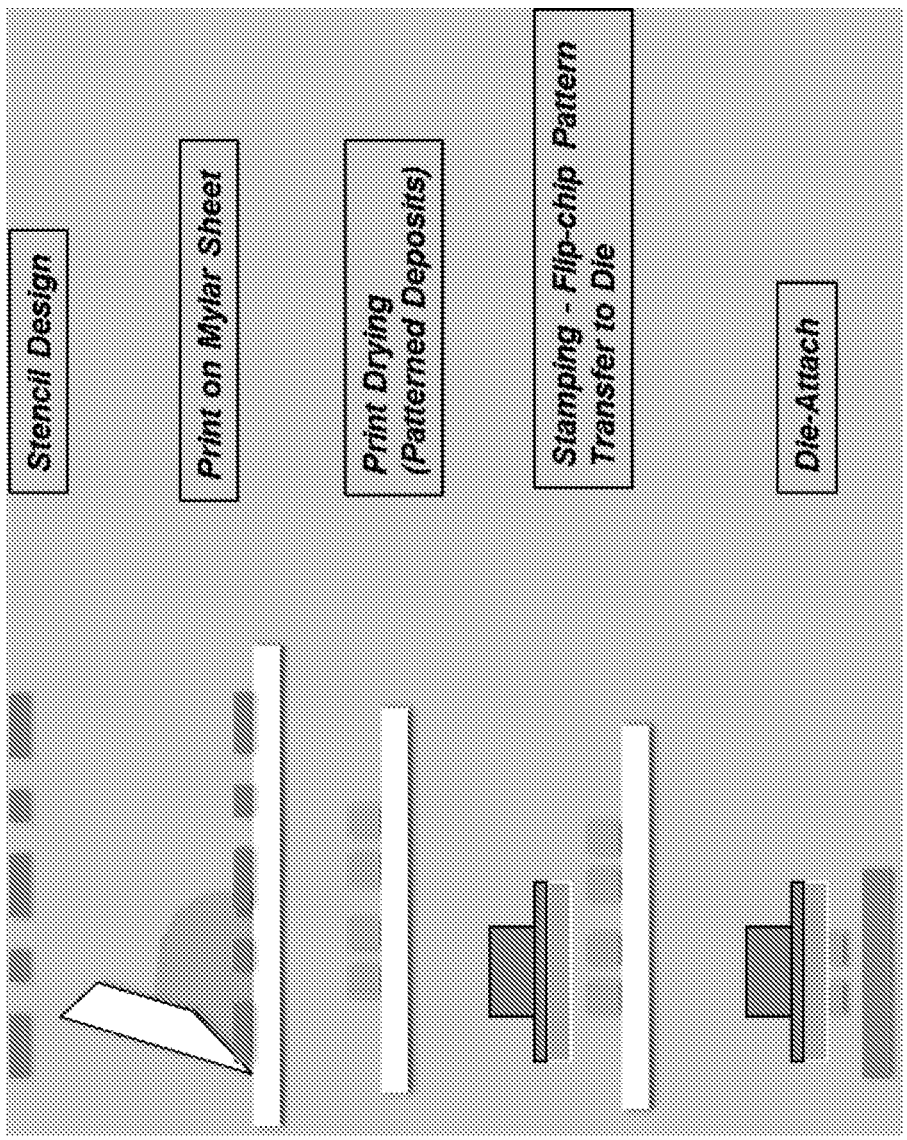
FIGS. 24 and 25 present schematics relating to methods involving flip chips in accordance with one or more embodiments.

In accordance with one or more specific embodiments as illustrated in FIG. 24, a method may involve steps of:
Printing the paste to form a film on a carrier sheet using an appropriate stencil
Drying the film to evaporate all the solvent
Placing the film on a thick silicone pad
Picking up a die from a wafer
Aligning the die pads with the printed and dried paste deposits on the carrier sheet
Pressing down the die and lifting it so that the paste deposit is transferred to the die pads
Placing the die on a substrate at a selected temperature and using an appropriate placement force
Sintering the assembly in an oven for a predetermined time and at a predetermined temperature.

Figure 25:
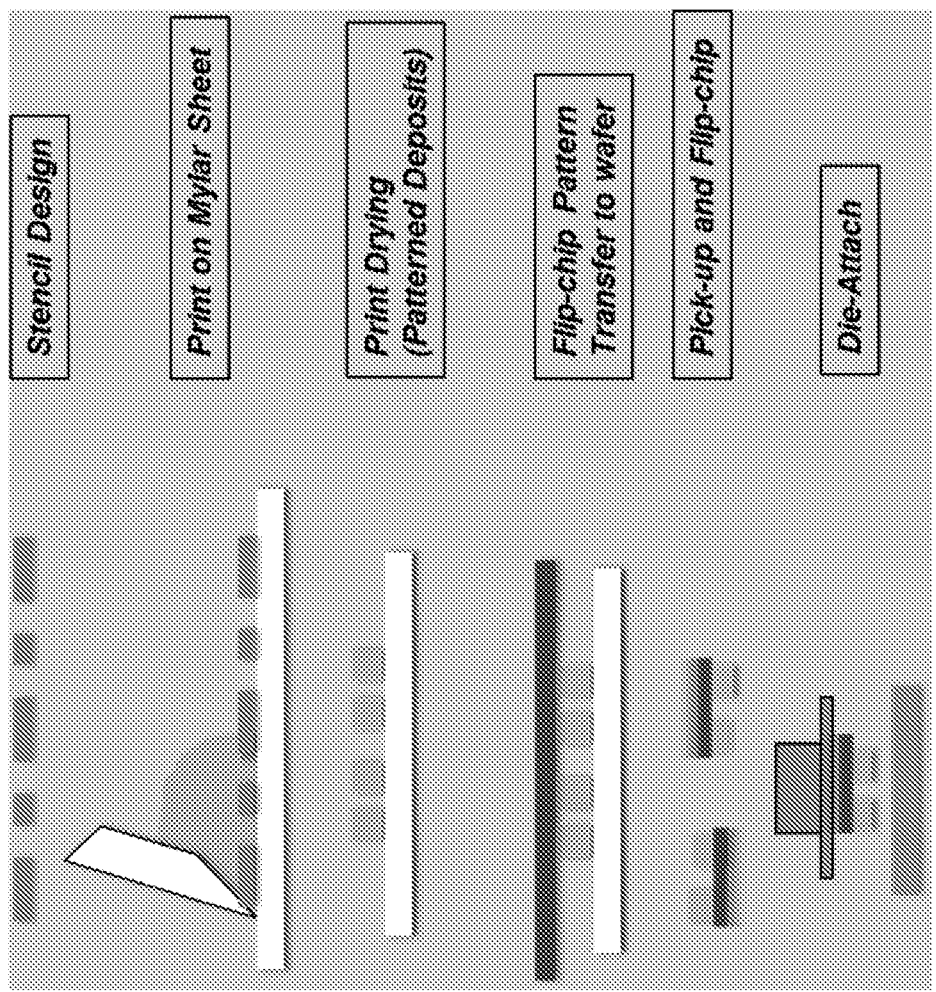

In accordance with one or more specific embodiments as illustrated in FIG. 25, a method may involve steps of:
Printing the paste to form a film on a carrier sheet using an appropriate stencil
Drying the film to evaporate all the solvent
Placing the film on a thick silicone pad
Placing a diced wafer on a patterned film and aligning die pads to the paste deposits
Pressing and heating to transfer the paste deposits from the film to the diced wafer In the electronics industry, semiconductor device interconnection to the substrate is an important part of device packaging. Most of the materials currently used for die attachment and interconnections are particularly the low melting solders which are not suitable because of the low operating temperature. Silver paste is commonly used in the microelectronic packages due to their high electrical and thermal performance. However, the high cost of silver limits their usage.

In accordance with one or more embodiments, core shell structured nanoparticles open a new possibility in printed electronics for the interconnect materials. Hence, nanoparticles of copper/nickel/molybdenum incorporated with silver in the form of a core-shell structure or a composite are expected to be potentially conducive conductive materials in terms of cost and utility. The below table provides a non-limiting list of some examples of different core shell structured nanoparticles which can be used for printing applications in accordance with one or more embodiments:

| Core Metal/non-metal | Shell metal/non-metal (Single/Multi layers) | Cappants (Single or Multi Layer) |
| --- | --- | --- |
| Copper | Silver | Amines |
| Nickel | Gold | Alcohols |
| Tin | Palladium | Fatty acids |
| Molybdenum | Platinum | Thiols |
| Tungsten | Nickel | Surfactants |
| Aluminium | Tin | |
| Carbon | | |
| Boron Nitride | | |
| Boron Carbide | | |
| Al Nitride | | |

Screen/stencil printing is a widely used technology for printed electronics and metallization of solar cells. The technique generally relies on pattern transfer from a stencil to a substrate. In accordance with one or more embodiments, $Ag_{shell}Cu_{core}$, $Ag_{shell}Mo_{core}$ and $Ag_{shell}Ni_{core}$ pastes of different compositions may be used for these types of applications. Some non-limiting examples of the percentage composition of $Ag_{shell}$ to the core metal (Cu, Mo, Ni etc) are listed below:
(10 to 90) wt % $Ag_{shell}$ and (90 to 10) wt % $Cu/Ni_{core}$
(10 to 90) wt % $Metal_{shell}$ and (90 to 10) wt % $Metal_{core}$ The function and advantages of these and other embodiments will be more fully understood from the following examples. The examples are intended to be illustrative in nature and are not to be considered as limiting the scope of the embodiments discussed herein.

Example 1

Figure 13:
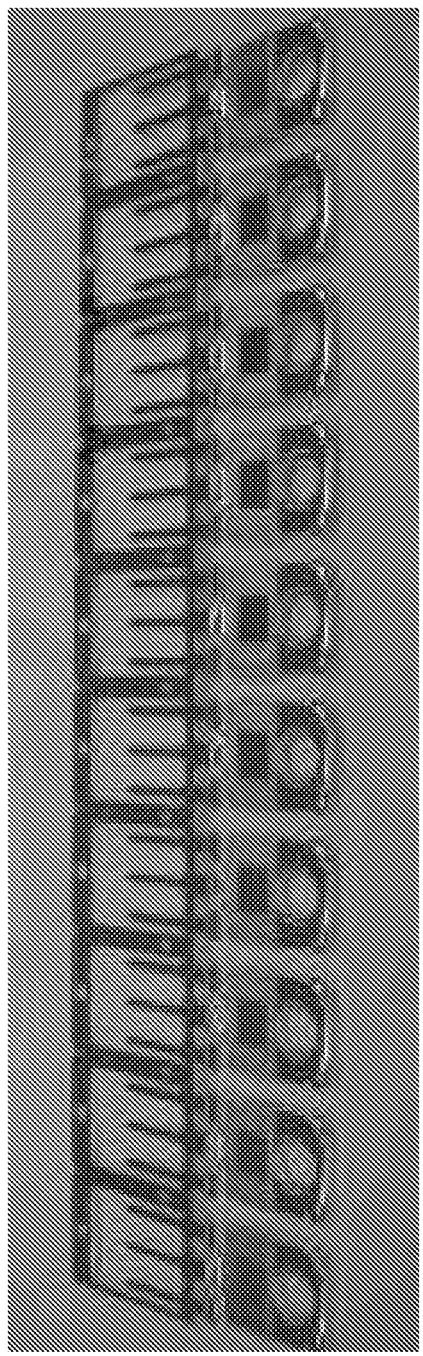
FIG. 13 illustrates a lead frame printed with nanosilver paste in accordance with one or more embodiments discussed in Example 1.
Figure 14:
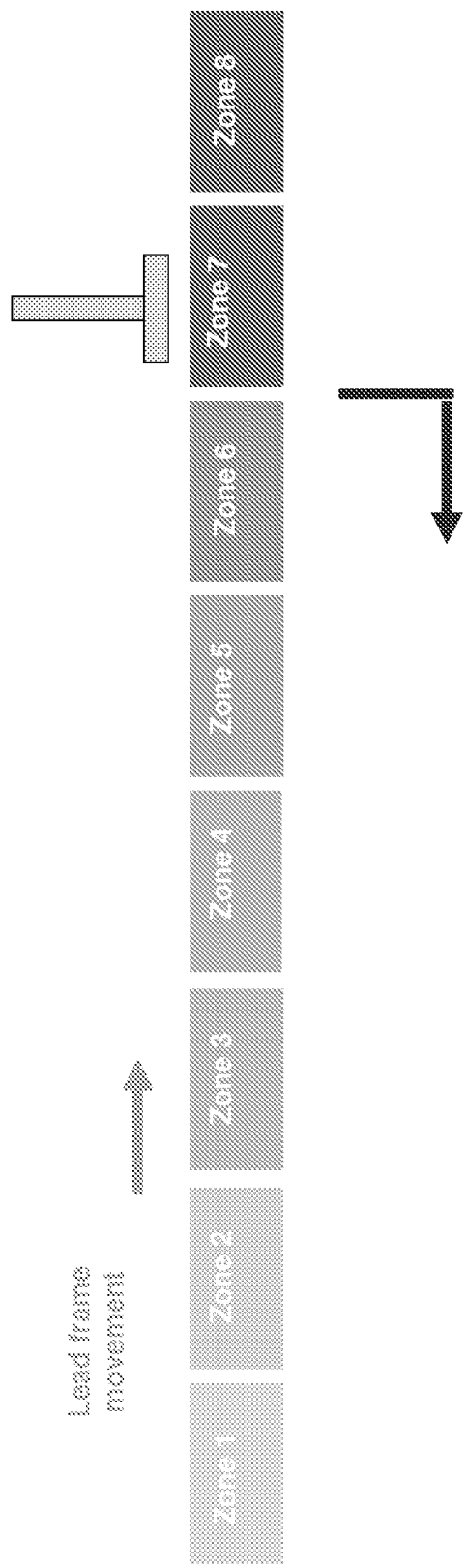
FIG. 14 presents a schematic of a process temperature profile in accordance with one or more embodiments discussed in Example 1.
Figure 15:
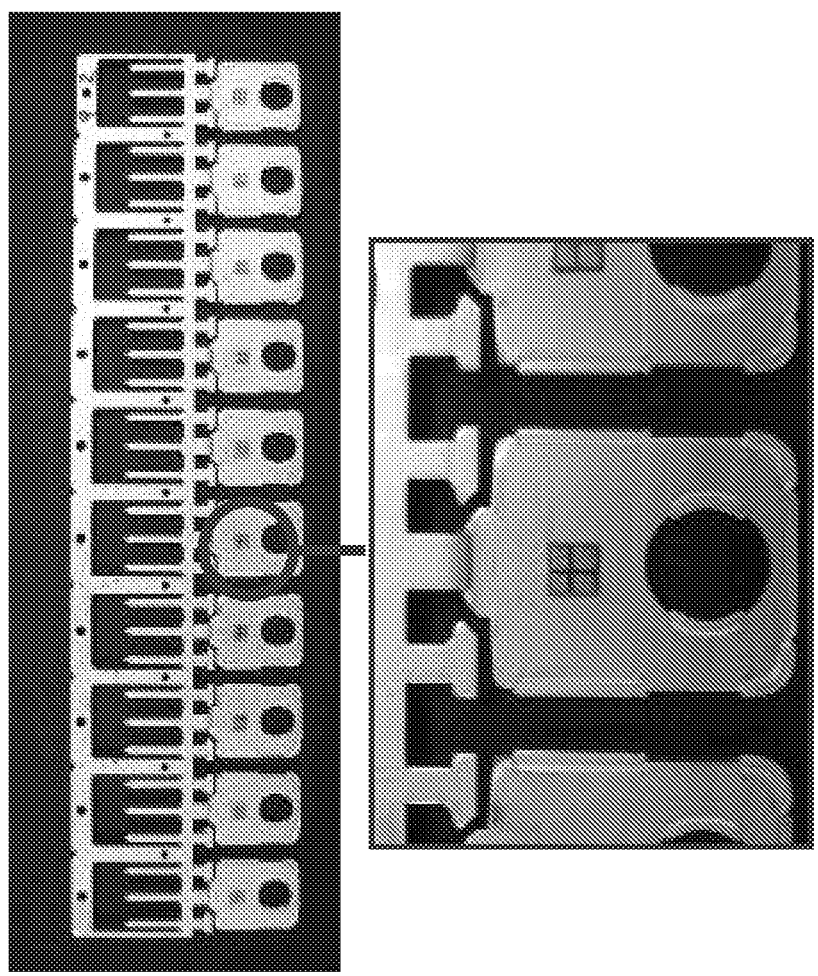
FIG. 15 illustrates a lead frame with attached dies in accordance with one or more embodiments discussed in Example 1.

FIG. 13 illustrates an example of a lead frame printed with nanosilver paste using a 100 micron thick stencil. The stencil thickness may generally dictate the bond line thickness. After printing, the lead frame was dried in the oven at 130° C. for 30 minutes. The equipment used to demonstrate the process was a soft solder die bonder commercially available from ESEC (Switzerland). The standard equipment was modified to provide a heating option on the pick-up arm. FIG. 14 presents the temperature settings that were used in various zones in which the temperature of the lead-frame was kept below 150° C. The temperature in heating zones 1 through 6 was set below 150° C., in order not to overheat and pre-sinter the paste. The temperature in zone 7 in which the attachment process took place was set to about 300° C. to about 400° C. and zone 8 was set to the same temperature. The printed lead frames were loaded into the machine which indexed them through the heat zones with a speed to provide a bonding time between 0.5 and 1 second. FIG. 15 illustrates a lead frame with the attached dies. After attachment of the dies in the soft solder bonder, some of the lead frame was heat treated (post-sintered) in the oven at 300° C. for about 10 minutes to increase die adhesion to the lead frame. The typical die shear force was about 20 MPa.

Figure 16:
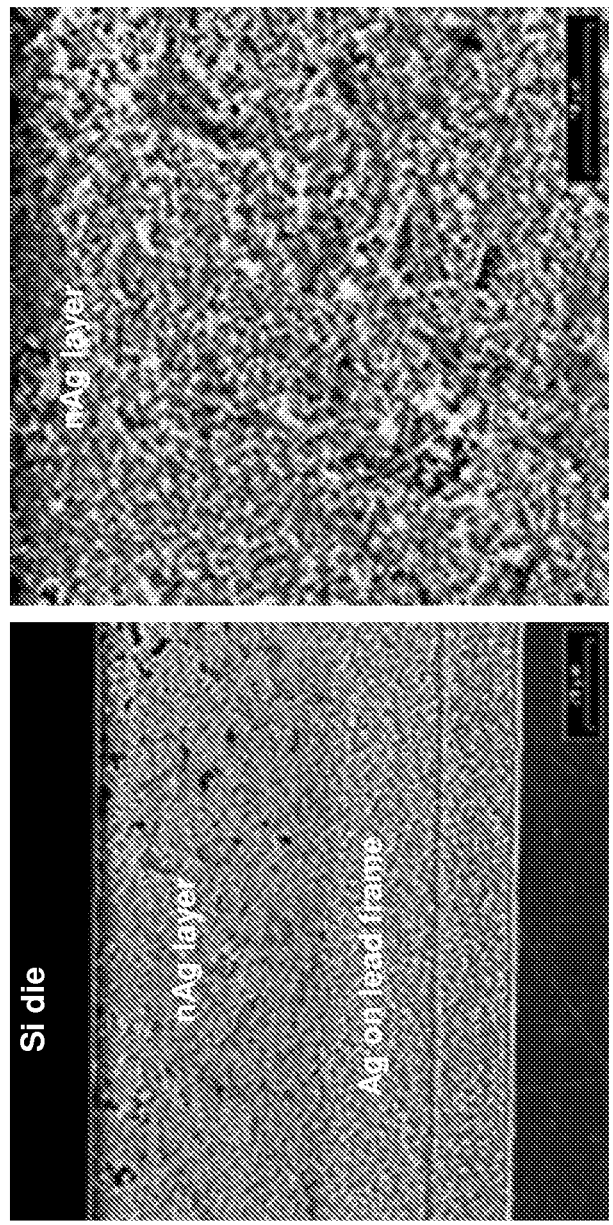
FIG. 16 illustrates a cross-section of a join in accordance with one or more embodiments discussed in Example 1.
Figure 17:
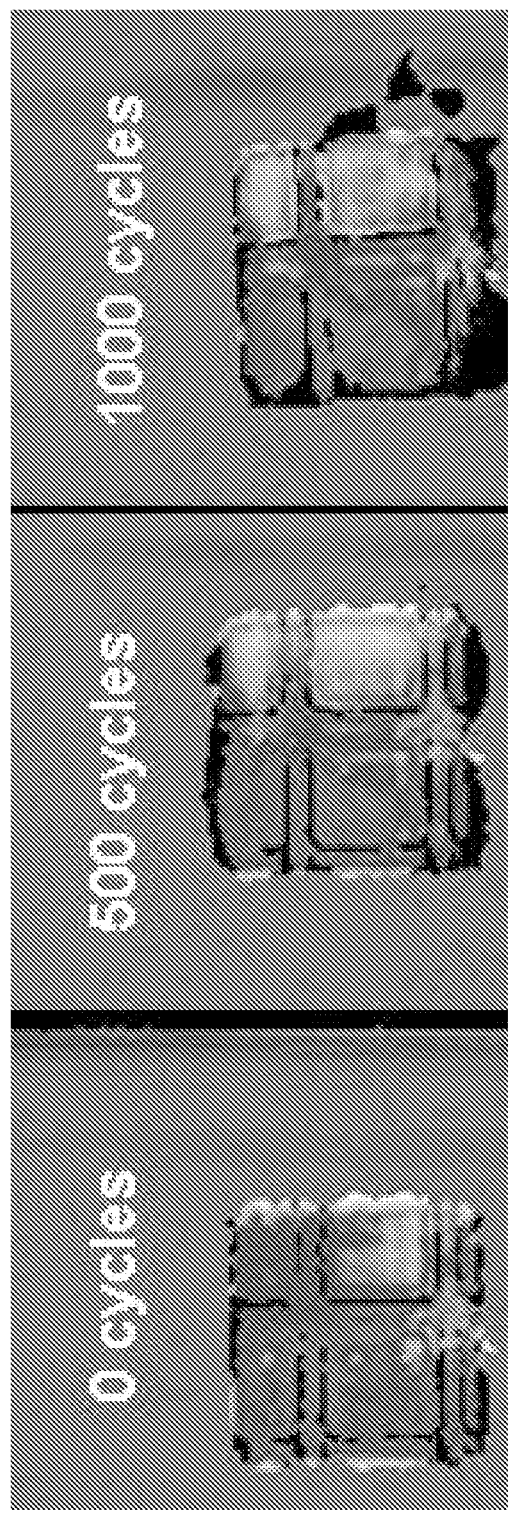
FIG. 17 illustrates acoustic microscope image data in accordance with one or more embodiments discussed in Example 1.

FIG. 16 illustrates a typical cross section of the created joint. Reliability of the joint was tested in a liquid-to liquid thermal shock test. Temperature settings were −50° C. to +125° C. with a 6 minute cycle time. Acoustic microscope images indicated no or only minor changes in the morphology of the joints indicating good reliable connection of the dies to the lead frame as illustrated in FIG. 17.

Example 2

Figure 18:
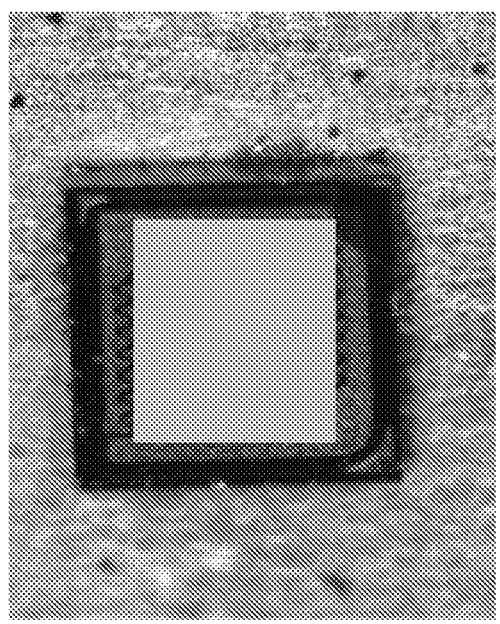
FIGS. 18 and 19 illustrate die attached by processes in accordance with one or more embodiments discussed in Example 2.
Figure 19:
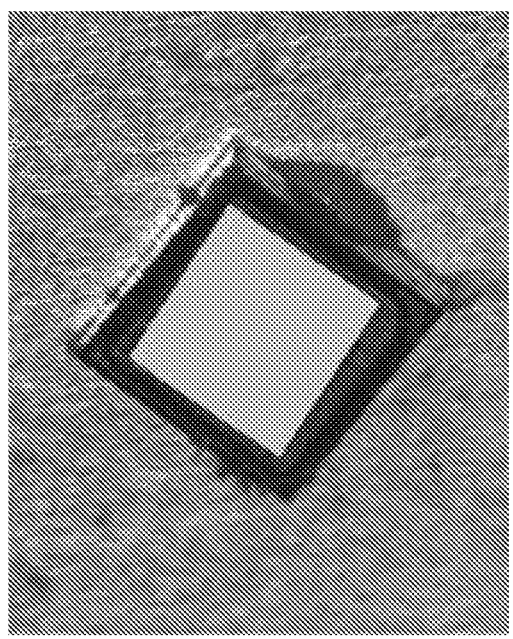

In accordance with one or more embodiments, the process for die attachment following dispensing may vary depending on the die size and equipment. In a first process, paste may be dispensed and then leveled using a nonstick surface, such as a Teflon® pad. The paste may then be dried, for example at about 130° C. for about 30 minutes. The die may then be placed and sintered, such as at a temperature of about 250° C. to 300° C. In a second process, paste may be dispensed and a die may be placed on the wet surface with minimum force. The paste may then be dried, for example, at about 130° C. for about 20 to 30 minutes. The die may then be placed and sintered at about 250° C. to 300° C. FIG. 18 illustrates a die attached by this second process. In a third process, paste may be dispensed and then partially dried so as to keep the paste soft. In some non-limiting embodiments, the partial drying may be at about 70° C. for about 5 minutes. The die may then be placed and sintered at about 250° C. to 300° C. following the partial drying. FIG. 19 presents a die attached by this third process.

Example 3

Figure 20C:
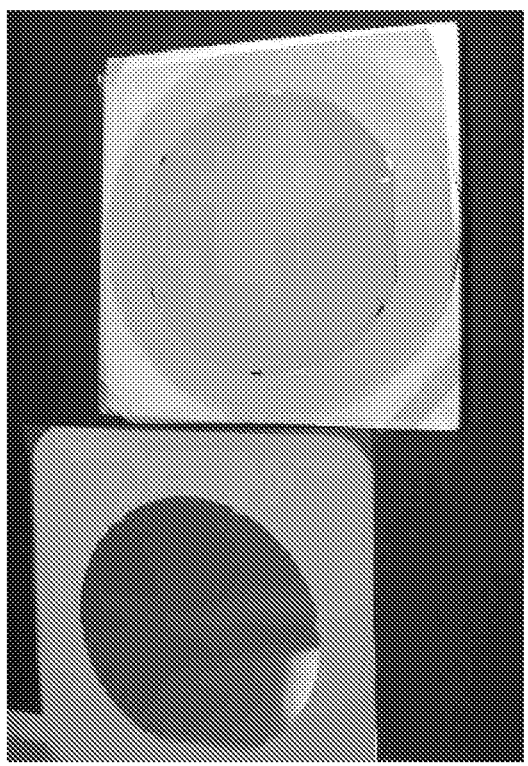
FIGS. 20A-20C illustrate a lamination process in accordance with one or more embodiments discussed in Example 3.
Figure 20A:
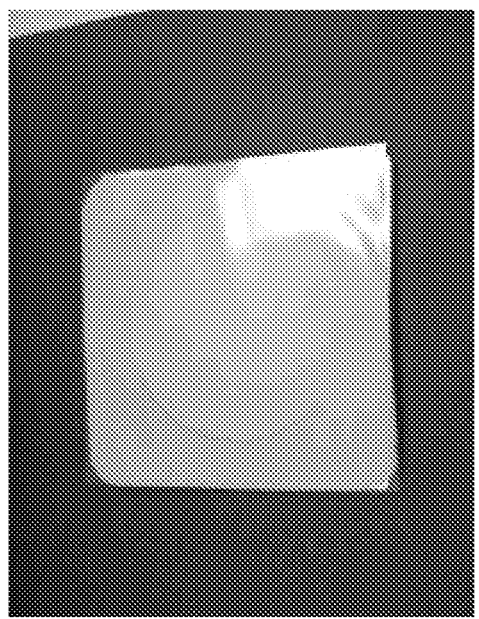
Figure 20B:
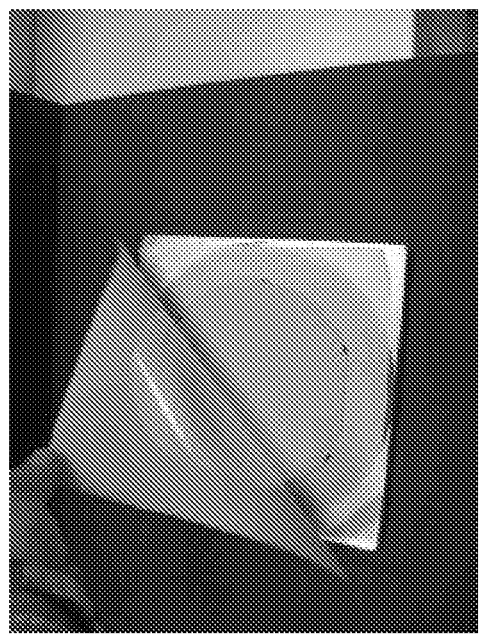

A wafer lamination process was demonstrated. A round silicone wafer with silver backside metallization was placed on an aluminum plate. A sheet of sintering film was placed on the wafer and a silicone rubber pad was placed on the sintering film. The silicone rubber pad was then covered with Teflon foil. The resulting assembly was placed on between pre-heated platens (130° C.) and a pressure of about 1 MPa was applied for about 3 minutes. The wafer and the film after lamination are illustrated in FIG. 20A. The sheet of sintering film was then removed from the wafer as illustrated in FIG. 20B. A round portion of the film was laminated to the silicone wafer thus exposing a portion of the backing layer on the sheet, and the rest of the sintering film remained on the backing layer. The laminated wafer is illustrated in FIG. 20C. The laminated wafer was then baked for about one hour at about 130° C.

Example 4

Figure 21:
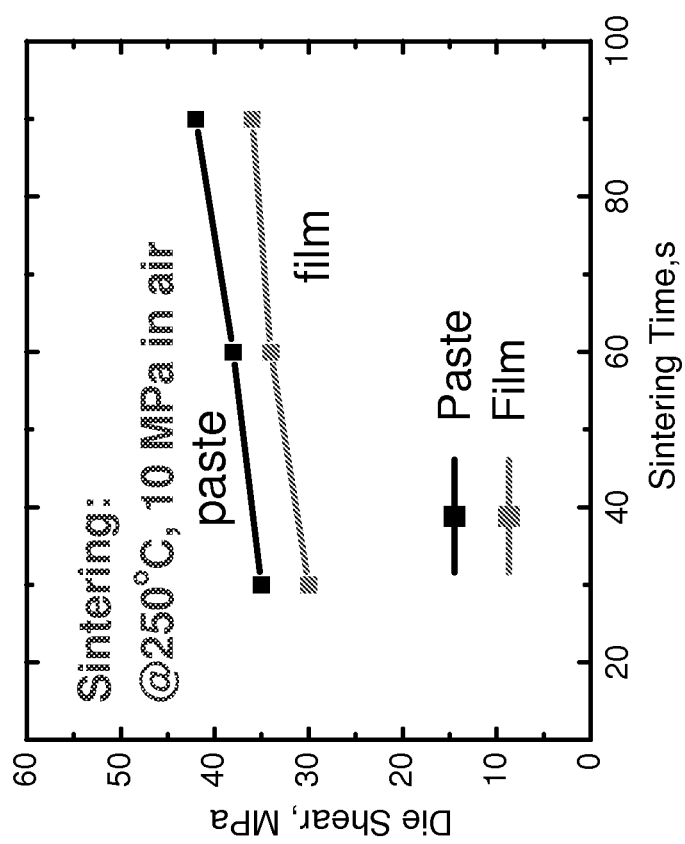
FIG. 21 illustrates die shear test data in accordance with one or more embodiments as discussed in Example 4.

Die were sintered to a substrate using the same sintering material in both paste and film forms in accordance with one or more embodiments. The process conditions for sintering with both the paste and film were about 250° C. at 10 MPa in air. Data was collected for sintering times of about 40 seconds, 60 seconds and 80 seconds. Die shear tests were performed for the resulting bonds formed using both the paste and the film. The results are illustrated in FIG. 21 and reflect comparable results for both formats.

Example 5

A pick and stamp process using a sintering film in accordance with one or more embodiments was demonstrated for both small dies and large dies using various combinations of the following equipment parameters:

| Equipment Variables | |
|---|---|
| Dies | 5 × 5 |
|  | 12 × 12 |
| Backing Foil | Thin (35 µm) |
|  | Thick (75 µm) |
| Stamping support | Stainless Steel cavity foil |
|  | 80 microns thick |
|  | 120 microns thick |
|  | 180 microns thick |
|  | Silicon Rubber |
|  | PCB Substrate |

Tests with an applied force of from about 10N to about 50N were conducted. Delay between applications of pressure by the nozzle ranged from 50 ms to 1000 ms. Tests with an applied temperature of from about 130° C. to about 160° C. were conducted.

For small dies, best results were obtained with the thin backing foil and using a PCB substrate as a stamping support. For large dies, best results were obtained with the thick backing foil and using a 120 microns thick stainless steel cavity foil as a stamping support. Optimal operating parameters for small dies were a force of about 2500 grams, a delay of about 500 ms and a nozzle temperature of about 145° C. Optimal operating parameters for both large dies were a force of about 2500 grams, a delay of about 1000 ms and a nozzle temperature of about 150° C. 1 mm minimal distance between two dies was achieved for both small and large dies.

Example 6

Figure 22B:
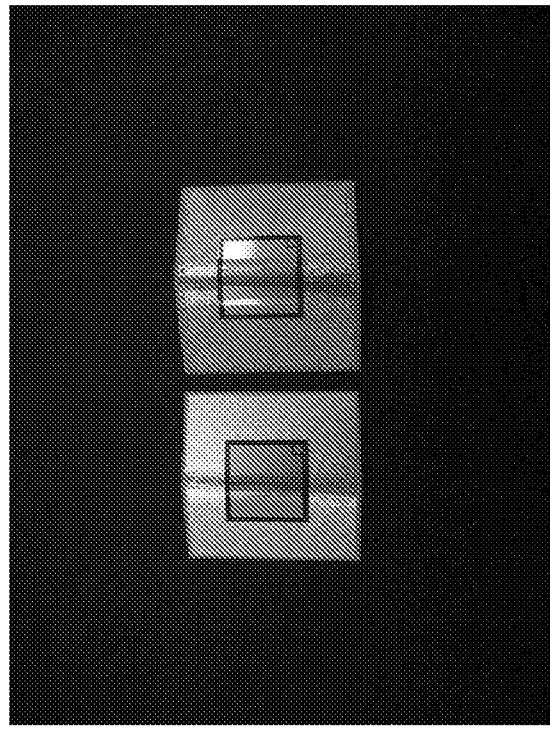
FIGS. 22A and 22B present data in accordance with one or more embodiments discussed in Example 6.
Figure 22A:
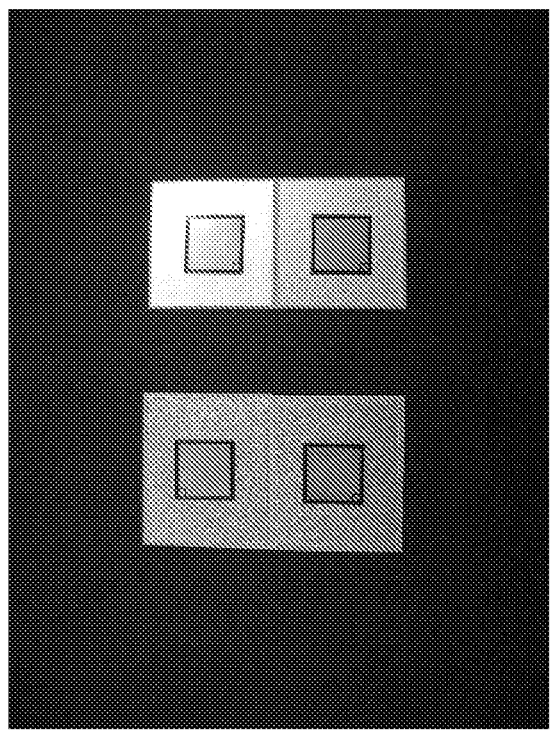
Figure 23A:
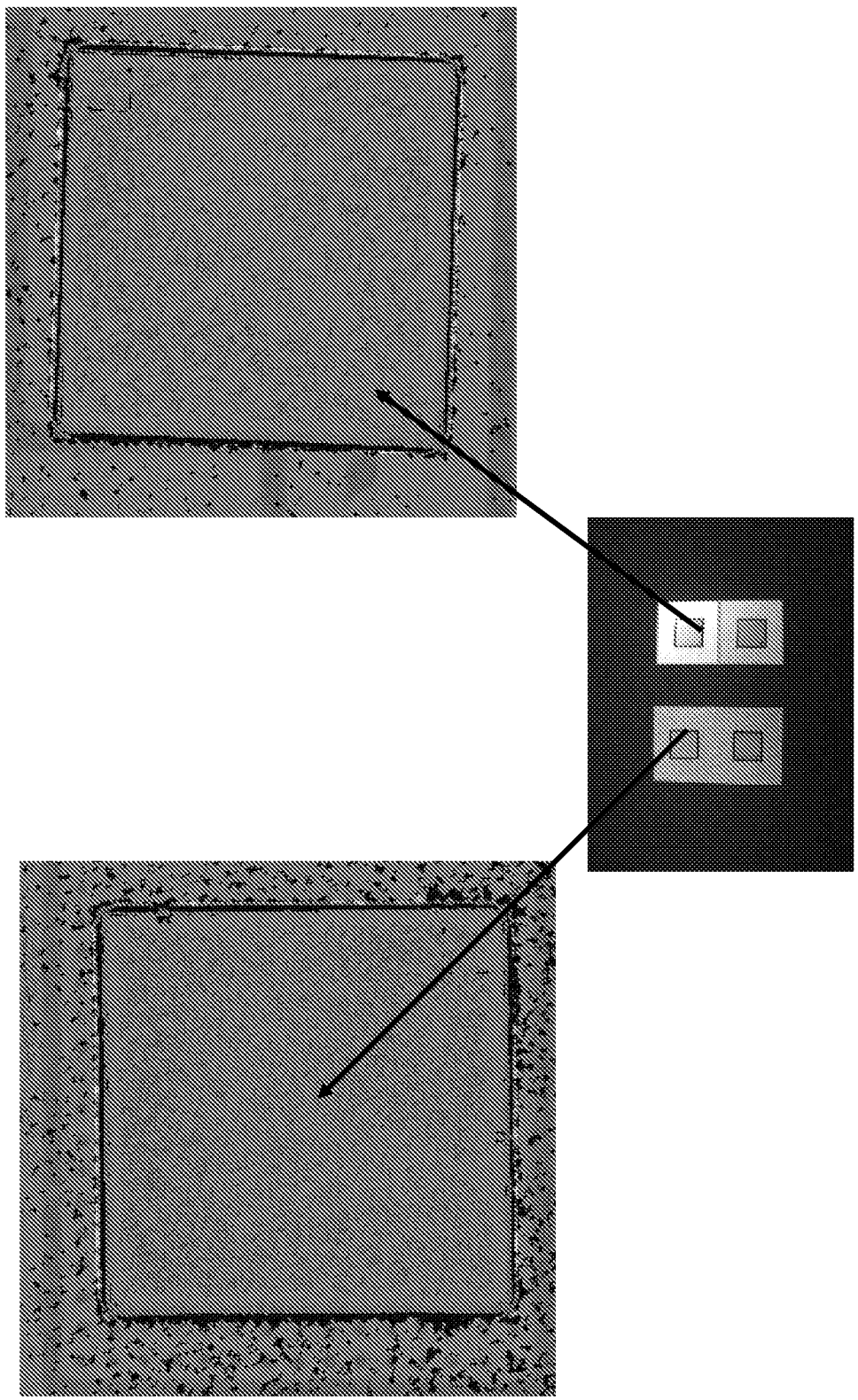

Dies were attached to gold and DBC substrates with sintering films in accordance with one or more embodiments. Images before a bend test are illustrated in FIG. 22A and images after the bend test are illustrated in FIG. 22B. The bend test showed no detachment of the die from the gold and DBC surfaces. FIG. 23A presents CSAM images before thermal shock. FIG. 23B presents acoustic microscope images after 500 cycles of liquid to liquid thermal shock from −50° C. to 165° C. No delamination or bond degradation was demonstrated indicating bond integrity.

Example 7

Paste was printed with a 1 mil stencil on a silicon coated polyester film/mylar. The printed pattern was a two pad design with dimensions of 360 micron by 60 micron having different range of pitch (60 um to 150 um) as shown in FIG. 26. The printed pattern on polyester/mylar sheet was then dried by heating at 60° C. for 3 minutes.

The fully dried printed pattern was transferred on to the die side (silicon with Au/Ni finish) by stamping at 60° C. (tool heating) under a pressure 10 MPa. Full transfer of the pattern was observed on the die side as shown in FIG. 27. The attachment of the die to the Au/Ni coated silicon wafer was carried out by heating the substrate (Au/Ag) and the tool at 160° C. and 60° C. respectively at a pressure of 10 MPa for 250 msec. The assembly was then sintered at 160° C. for 30 minutes in a box oven.

With the above mentioned process, a joint strength of around 35-50 MPa was achieved. The sheared samples show bulk failure.

Example 8

Figure 32:
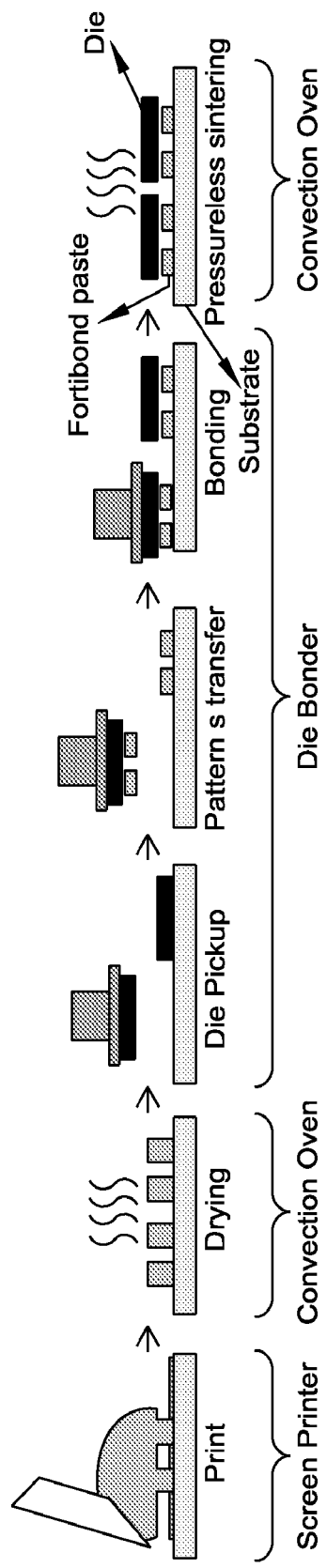
FIG. 32 presents a schematic of a processing method in accordance with one or more embodiments.

A process according to FIG. 32 was performed. Paste was printed with a stencil on a silicon coated polyester film/ mylar. The printed pattern on polyester/mylar sheet was then dried by heating at 60° C. for 3 minutes. The fully dried printed pattern was transferred on to the die side (silicon with Au/Ni finish) by stamping at 85° C. (tool heating) under a pressure 500 gms.

Figure 29:
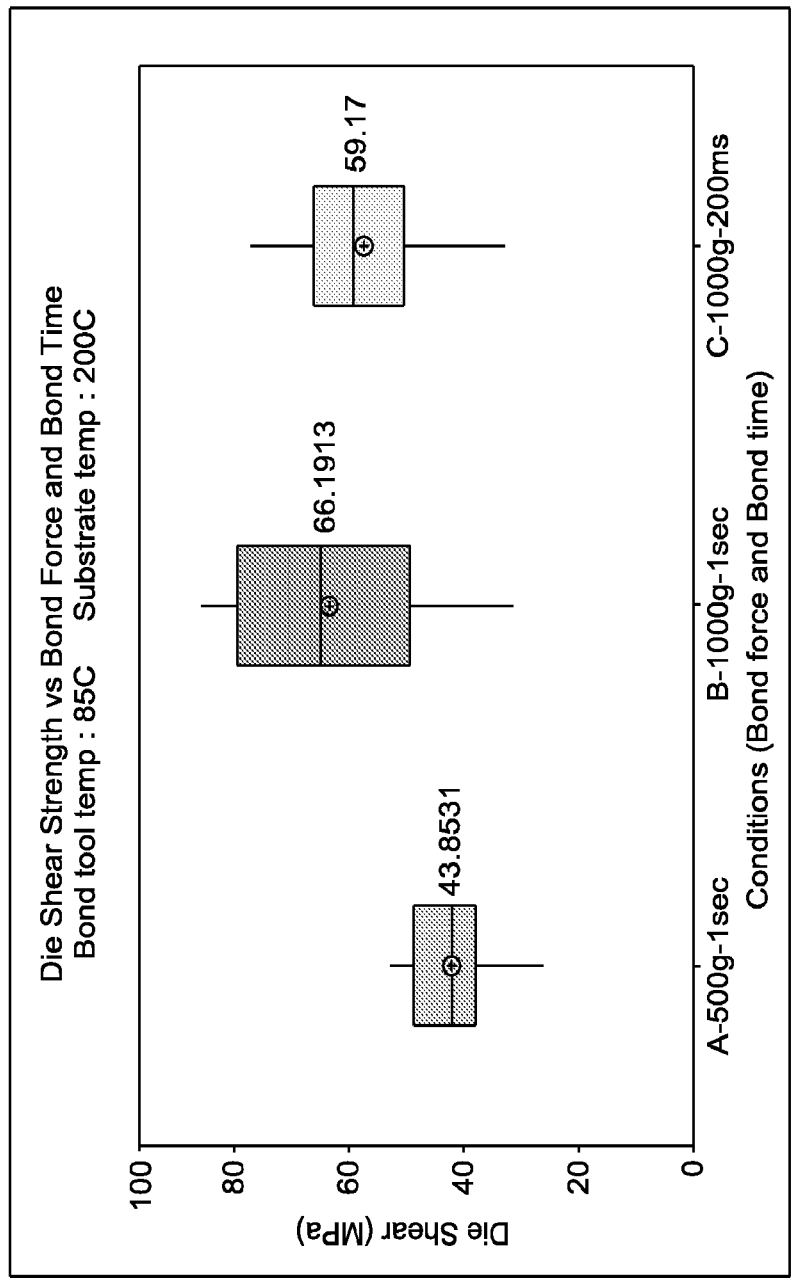
Figure 30:
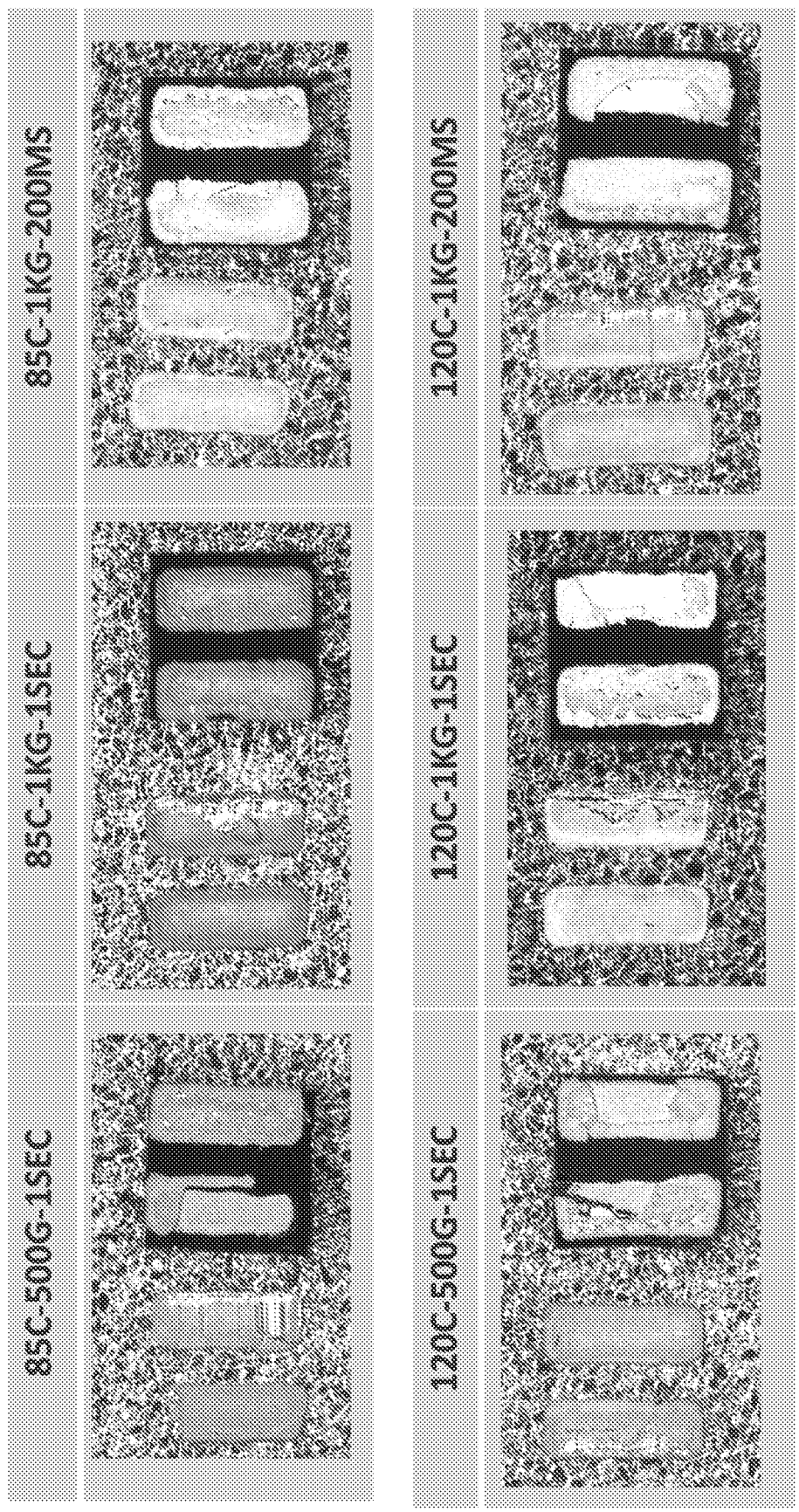

Attachment of a die to the substrate (Au/Ag) was carried out by heating the substrate (Ag/Au) and the tool at 200° C. and 85° C. respectively at a bonding pressure of 1000 gms and a binding time of 200 ms. The assembly was then sintered at 200° C. for 90 minutes in a box oven. From this process, a shear strength of around 50-70 MPa was achieved, as can be seen in FIG. 29. The sheared samples show bulk failure, as can be seen in FIG. 30.

Figure 31:
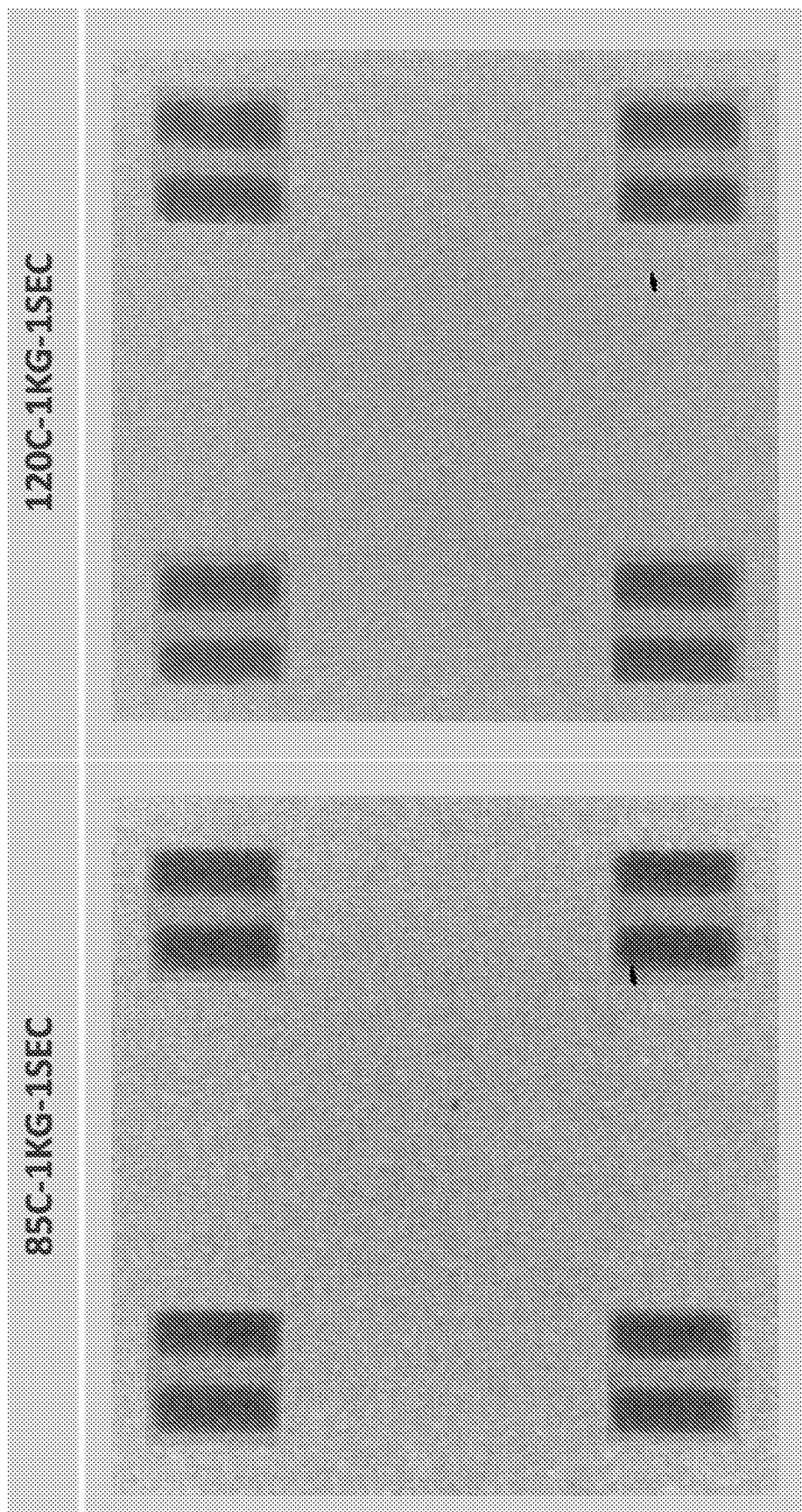

The process was repeated with a bonding time of 1 s. From this process, a die shear strength of around 50-85 MPa was achieved, as can be seen in FIG. 29. The sheared samples show bulk failure, as can be seen in FIG. 30. Relative bond strength is illustrated in FIG. 31.

Example 9

The process according to FIG. 32 was performed. Paste was printed with a stencil on a silicon coated polyester film/mylar. The printed pattern on polyester/mylar sheet was then dried by heating at 60° C. for 3 minutes. The fully dried printed pattern was transferred on to the die side (silicon with Au/Ni finish) by stamping at 120° C. (tool heating) under a pressure 500 gms.

Attachment of a die to the substrate (Au/Ag) was carried out by heating the substrate (Ag/Au and the tool at 200° C. and 120° C. respectively at a bonding pressure of 1000 gms and a bonding time of 200 ms. The assembly was then sintered at 200° C. for 90 minutes in a box oven.

Figure 28:
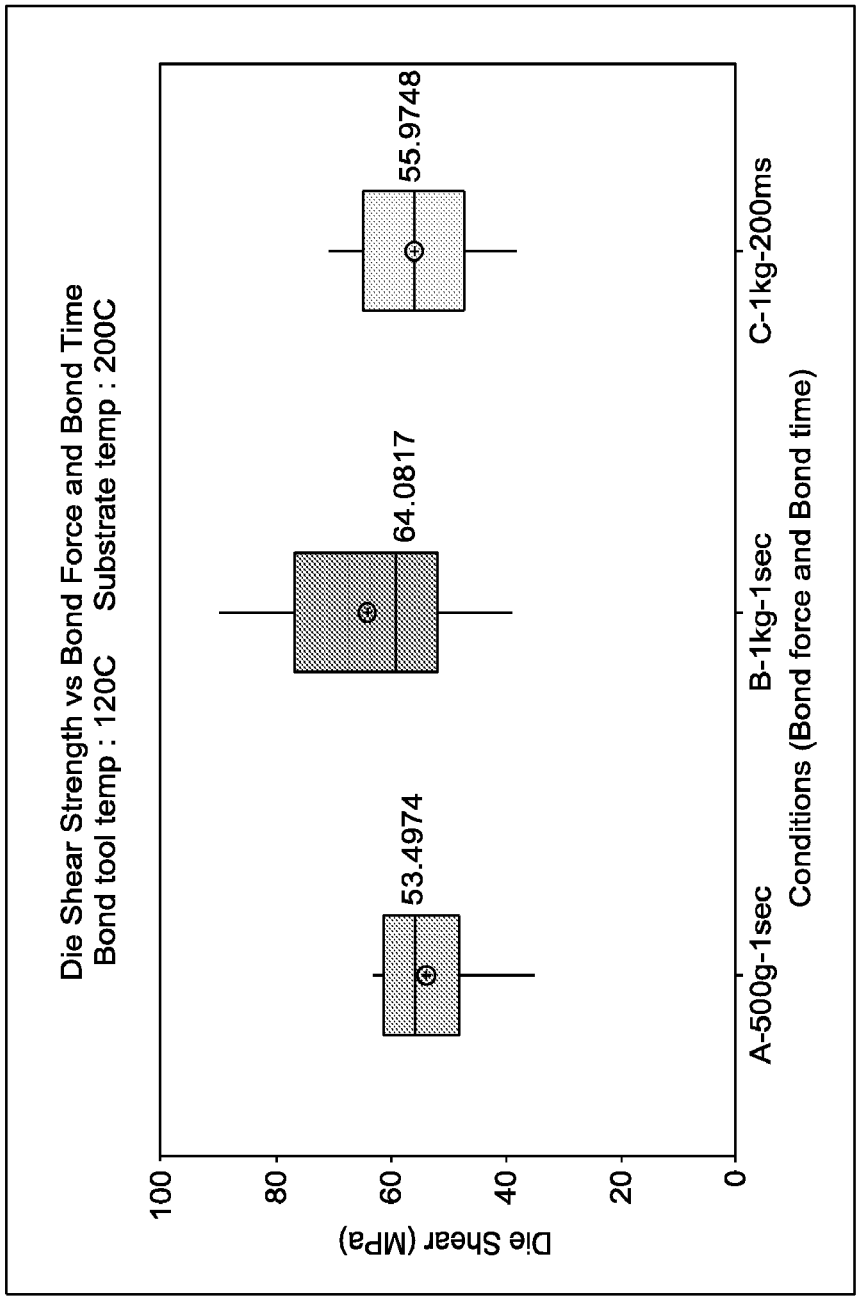
FIGS. 28-31 present data in accordance with one or more accompanying Examples.

From this process, a shear strength of around 50-65 MPa was achieved, as can be seen in FIG. 28. The sheared samples show bulk failure, as can be seen in FIG. 30.

The process was repeated with a bonding pressure of 500 gms and a bonding time of 1 s. From this process, a die shear strength of around 45-65 MPa was achieved, as can be seen in FIG. 28. The sheared samples show, bulk failure as can be seen in FIG. 30.

The process was again repeated with a bonding pressure of 1000 gms and a bonding time of 200 ms. From this process, a die shear strength of around 40-60 Mpa was achieved, as can be seen in FIG. 28 The sheared samples show bulk failure as can be seen in FIG. 30.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiment.

Also, the phraseology and terminology used herein is for the purpose of description and should not be regarded as limiting. Any references to embodiments or elements or acts of the systems and methods herein referred to in the singular may also embrace embodiments including a plurality of these elements, and any references in plural to any embodiment or element or act herein may also embrace embodiments including only a single element. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only.

What is claimed is:

1. A method for attachment, comprising:
    applying a film of metal particles to a substrate;
    placing a die or a wafer on the film to form an assembly;
    applying a pressure of less than 40 MPa to the assembly; and
    sintering the assembly at a temperature of 160 to 400° C. for 0.25 seconds to 120 minutes;
    wherein the metal particles comprise core shell structured nanoparticles comprising a core material selected from the group consisting of molybdenum, tungsten, aluminum, carbon, boron nitride, boron carbide, and aluminum nitride and a shell material selected from the group consisting of silver, gold, palladium, platinum, nickel, and tin,
    wherein the core shell structured nanoparticles consist of 10 to 90 weight percent of the core material and 10 to 90 weight percent of the shell material, and
    wherein the core shell structured nanoparticles constitute from 80 to 95 weight percent of the metal film.

2. The method of claim 1, further comprising forming the die by dicing a wafer.

3. The method of claim 2, wherein the die comprises a flip chip.

4. The method of claim 1, further comprising applying a film of metal particles on a back side of the die or wafer.

5. The method of claim 4, wherein a pressure of 2.0 to 10 MPa is applied.

6. The method of claim 1, wherein a pressure of 0.5 to 20 MPa is applied.

7. The method of claim 6, wherein a pressure of 2.0 to 10 MPa is applied.

8. The method of claim 1, wherein the temperature is 200° C.

9. The method of claim 1, wherein the substrate has a thickness of between 35 micrometers and 75 micrometers.

10. The method of claim 1, further comprising post-treating the assembly at a temperature of 300° C. for 5 to 60 minutes.

11. The method of claim 1, wherein the film comprises the metal particles and from 0.5 to 5 wt % of a binder having a softening point of between 50 and 170° C.

12. The method of claim 11, wherein the binder is a partially hydrogenated rosin ester.

13. The method of claim 1,
    wherein the metal particles of the film consist essentially of core shell structured nanoparticles comprising a core material selected from the group consisting of tungsten, boron nitride, boron carbide, and aluminum nitride and a shell material selected from the group consisting of silver, gold, palladium, platinum, nickel, and tin.

14. The method of claim 1, wherein the core shell structured nanoparticles of the metal film consist of nanoparticles comprising a core material selected from the group consisting of molybdenum, tungsten, aluminum, carbon, boron nitride, boron carbide, and aluminum nitride and a shell material selected from the group consisting of silver, gold, palladium, platinum, nickel, and tin.

15. A method for attachment, comprising:
applying a film of metal particles to a substrate;
placing a die or a wafer on the film to form an assembly;
applying a pressure of less than 40 MPa to the assembly; and
sintering the assembly at a temperature of 160 to 400° C. for 0.25 seconds to 120 minutes;
wherein the metal particles of the film consist of core shell structured nanoparticles comprising a core material selected from the group consisting of molybdenum, tungsten, aluminum, carbon, boron nitride, boron carbide, and aluminum nitride and a shell material selected from the group consisting of silver, gold, palladium, platinum, nickel, and tin,
wherein the core shell structured nanoparticles constitute from about 30 to about 95 weight percent of the metal film, and
wherein the core shell structured nanoparticles consist of 10 to 90 weight percent of the core material and 10 to 90 weight percent of the shell material.

16. The method of claim 15, wherein the metal particles of the film consist of core shell structured nanoparticles comprising 10 to 90 wt % of a Mo core and 10 to 90 wt % of a Ag shell.

17. The method of claim 15, wherein the core material is molybdenum.

18. The method of claim 15, wherein the core material is tungsten.

19. The method of claim 15, wherein the core material is carbon.

20. The method of claim 15, wherein the core material is boron nitride.

21. The method of claim 15, wherein the core material is boron carbide.

22. The method of claim 15, wherein the core material is aluminum nitride.

23. A method for attachment, comprising:
applying a film of metal particles to a substrate;
placing a die or a wafer on the film to form an assembly;
applying a pressure of less than 40 MPa to the assembly; and
sintering the assembly at a temperature of 160 to 400° C. for 0.25 seconds to 120 minutes;
wherein the metal particles comprise core shell structured nanoparticles comprising a core material and a shell material selected from the group consisting of silver, gold, palladium, platinum, nickel, and tin, wherein the core material is aluminum,
wherein the core shell structured nanoparticles constitute from about 30 to about 95 weight percent of the metal film, and
wherein the core shell structured nanoparticles consist of 10 to 90 weight percent of the core material and 10 to 90 weight percent of the shell material.

* * * * *